(12) United States Patent
Ichikawa et al.

(10) Patent No.: US 10,840,472 B2
(45) Date of Patent: Nov. 17, 2020

(54) DISPLAY DEVICE AND LIGHT EMITTING DEVICE

(71) Applicant: Sony Corporation, Tokyo (JP)

(72) Inventors: Tatsuya Ichikawa, Kanagawa (JP); Taizo Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 87 days.

(21) Appl. No.: 15/761,164

(22) PCT Filed: Jul. 29, 2016

(86) PCT No.: PCT/JP2016/072376
§ 371 (c)(1),
(2) Date: Mar. 19, 2018

(87) PCT Pub. No.: WO2017/051606
PCT Pub. Date: Mar. 30, 2017

(65) Prior Publication Data
US 2018/0261790 A1    Sep. 13, 2018

(30) Foreign Application Priority Data
Sep. 24, 2015  (JP) ................................. 2015-186503

(51) Int. Cl.
*H01L 51/50*  (2006.01)
*H01L 27/32*  (2006.01)
(Continued)

(52) U.S. Cl.
CPC ...... *H01L 51/5092* (2013.01); *H01L 27/3209* (2013.01); *H01L 27/3241* (2013.01);
(Continued)

(58) Field of Classification Search
CPC .................. H01L 27/3209; H01L 51/5044
See application file for complete search history.

(56) References Cited

U.S. PATENT DOCUMENTS

2012/0205709 A1*  8/2012  Yamazaki ........... H01L 51/5044
257/99

FOREIGN PATENT DOCUMENTS

JP       11-162637 A    6/1999
JP     2004-095388 A    3/2004
(Continued)

*Primary Examiner* — Raj R Gupta
(74) *Attorney, Agent, or Firm* — Michael Best & Friedrich LLP

(57) ABSTRACT

A display device having light emitting elements that respectively include a first electrode formed on a substrate, a laminated structure formed on the first electrode, and a second electrode formed on the laminated structure. The laminated structure is formed by laminating, in the following order from the first electrode side, at least a first organic layer including a first light emitting layer, a charge generation layer in which a first layer into which a first carrier is injected and a second layer into which a second carrier is injected are laminated, and a second organic layer including a second light emitting layer. In a light emitting element including a defect region, the charge generation layer is in a high electrical resistance state or an insulated state in the defect region, while being in a low electrical resistance state in a region other than the defect region.

19 Claims, 12 Drawing Sheets

(51) Int. Cl.
*H05B 33/22* (2006.01)
*H01L 51/52* (2006.01)

(52) U.S. Cl.
CPC ...... *H01L 51/5044* (2013.01); *H01L 51/5206* (2013.01); *H01L 51/5221* (2013.01); *H05B 33/22* (2013.01); *H01L 27/322* (2013.01); *H01L 27/3244* (2013.01); *H01L 27/3248* (2013.01); *H01L 51/5284* (2013.01); *H01L 2251/568* (2013.01)

(56) References Cited

FOREIGN PATENT DOCUMENTS

| | | | |
|---|---|---|---|
| JP | 2004-227852 | A | 8/2004 |
| JP | 2011-049159 | A | 3/2011 |
| JP | 2011-249349 | A | 12/2011 |
| JP | 2012-182444 | A | 9/2012 |
| JP | 2013-197298 | A | 9/2013 |
| JP | 2013-207010 | A | 10/2013 |
| JP | 2015-088319 | A | 5/2015 |

\* cited by examiner

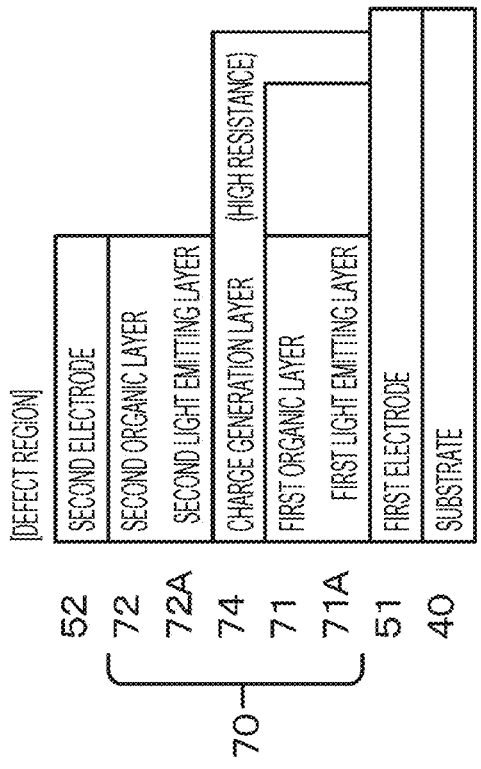
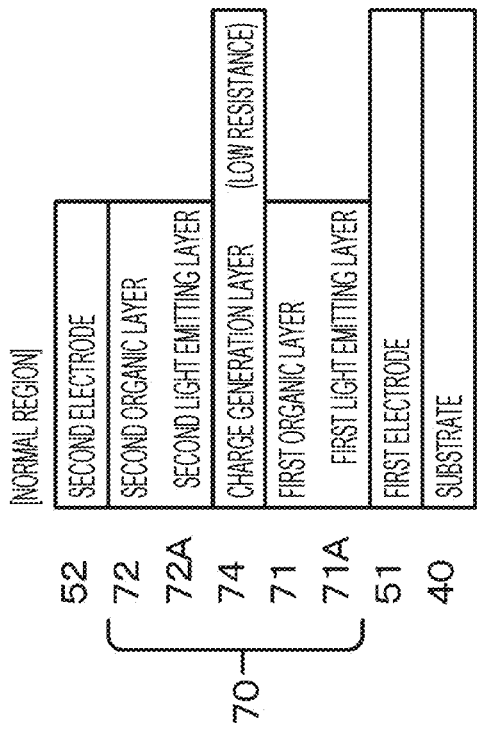

DISPLAY DEVICE AND LIGHT EMITTING DEVICE

TECHNICAL FIELD

The present disclosure relates to a display device and a light emitting device.

BACKGROUND ART

In recent years, as a display device substituted for a liquid crystal display device, an organic electroluminescence display device (hereinafter, also simply abbreviated as an "organic EL display device") using an organic electroluminescence element (hereinafter, also simply abbreviated as an "organic EL element") has attracted attention. The organic EL display device is a self-luminous type, has a characteristic of low power consumption, and is considered to have sufficient responsiveness even to a high-definition high-speed video signal. Development and commercialization of the organic EL display device for practical use are keenly proceeding. In addition, development and commercialization of a light emitting device (lighting device) using an organic EL element as a light emitting portion are also keenly proceeding. An organic EL element generally has a structure in which a first electrode, an organic layer including a light emitting layer containing an organic light emitting material, and a second electrode are sequentially laminated.

By the way, for example, if particles (foreign matters) or protrusions are present on the first electrode, or a break or a cut portion is generated in the first electrode, coverage of the organic layer is insufficient, and a short circuit may occur between the first electrode and the second electrode. In addition, if such a short circuit occurs, in an active matrix type organic EL display device, pixels including the short circuit become defects, and a display quality of the organic EL display device is deteriorated. In addition, in a passive matrix organic EL display device, a line is broken, and a display quality of the organic EL display device is also deteriorated.

For example, Japanese Patent Application Laid-open No. 2013-207010 discloses a means for solving such a problem. Specifically, a first resistive layer and a second resistive layer are disposed between an organic layer and a second electrode from a side of the organic layer.

In addition, for example, Japanese Patent Application Laid-Open No. 2011-249349 discloses an organic EL element having a structure obtained by sequentially laminating a first electrode, a first organic layer including a first light emitting layer containing an organic light emitting material, a charge generation layer, a second organic layer including a second light emitting layer containing an organic light emitting material, and a second electrode.

CITATION LIST

Patent Document

Patent Document 1: Japanese Patent Application Laid-Open No. 2013-207010
Patent Document 2: Japanese Patent Application Laid-Open No. 2011-249349

SUMMARY OF THE INVENTION

Problems to be Solved by the Invention

An organic EL element disclosed in Japanese Patent Application Laid-Open No. 2013-207010 can effectively prevent a short circuit between a first electrode and a second electrode. However, it is necessary to form a resistor layer, and the number of steps of manufacturing an organic EL element is increased, productivity is reduced, and manufacturing cost is increased disadvantageously. In addition, it is impossible to prevent a short circuit between a charge generation layer and the first electrode (refer to FIG. 3). A short circuit caused between the charge generation layer and the first electrode causes deterioration of an image quality, such as color unevenness or color shift.

Therefore, a first object of the present disclosure is to provide a display device and a light emitting device having a configuration and a structure capable of preventing a short circuit between a charge generation layer and a first electrode. In addition, a second object of the present disclosure is to provide a display device and a light emitting device having a configuration and a structure capable of preventing a short circuit between the first electrode and a second electrode without forming a resistor layer.

Solutions to Problems

A display device according to a first aspect of the present disclosure for achieving the first object is a display device having light emitting elements arranged in a two-dimensional matrix, in which
each of the light emitting elements includes:
(A) a first electrode formed on a substrate;
(B) a laminated structure formed on the first electrode; and
(C) a second electrode formed on the laminated structure, the laminated structure is formed by laminating:
in the following order from the first electrode side, at least
(B-1) a first organic layer including a first light emitting layer containing an organic light emitting material;
(B-2) a charge generation layer in which a first layer into which a first carrier is injected and a second layer into which a second carrier is injected are laminated; and
(B-3) a second organic layer including a second light emitting layer containing an organic light emitting material, and
in a light emitting element including a defect region, the charge generation layer is in a high electrical resistance state or an insulated state in a defect region, while being in a low electrical resistance state in a region other than the defect region.

A display device according to a second aspect of the present disclosure for achieving the second object is a display device having light emitting elements arranged in a two-dimensional matrix, each of the light emitting elements being formed by laminating: in the following order,
(A) a first electrode formed on a substrate;
(B) an organic layer including a light emitting layer containing an organic light emitting material; and
(C) a second electrode, in which
each of the light emitting elements further includes an electrode connection layer between the second electrode and the organic layer or between the first electrode and the organic layer, and
in a light emitting element including a defect region, the electrode connection layer is in a high electrical resistance state or an insulated state in a defect region, while being in a low electrical resistance state in a region other than the defect region.

A light emitting device according to the first aspect of the present disclosure for achieving the first object is a light emitting device including a light emitting portion including:

(A) a first electrode formed on a substrate;

(B) a laminated structure formed on the first electrode; and (C) a second electrode formed on the laminated structure, in which the laminated structure is formed by laminating:

in the following order from the first electrode side, at least (B-1) a first organic layer including a first light emitting layer containing an organic light emitting material;

(B-2) a charge generation layer in which a first layer into which a first carrier is injected and a second layer into which a second carrier is injected are laminated; and (B-3) a second organic layer including a second light emitting layer containing an organic light emitting material, and the charge generation layer is in a high electrical resistance state or an insulated state in a defect region, while being in a low electrical resistance state in a region other than the defect region.

A light emitting device according to the second aspect of the present disclosure for achieving the second object is a light emitting device including a light emitting portion formed by laminating: in the following order, (A) a first electrode formed on a substrate;

(B) an organic layer including a light emitting layer containing an organic light emitting material; and (C) a second electrode, in which the light emitting portion further includes an electrode connection layer between the second electrode and the organic layer or between the first electrode and the organic layer, and the electrode connection layer is in a high electrical resistance state or an insulated state in a defect region, while being in a low electrical resistance state in a region other than the defect region.

Effects of the Invention

In the display device or the light emitting device according to the first or second aspect of the present disclosure, the charge generation layer or the electrode connection layer is in a high electrical resistance state or an insulated state in a defect region, while being in a low electrical resistance state in a region other than the defect region. By the way, according to studies by the present inventors, it has been found that many oxygen atoms or nitrogen atoms exist in the defect region. In addition, as a result of bonding of these oxygen atoms or nitrogen atoms to atoms constituting the charge generation layer or the electrode connection layer (for example, an alkali metal or an alkaline earth metal described below), it is considered that the charge generation layer or the electrode connection layer is oxidized or nitrided in the defect region, and that such an electrical resistance state of the charge generation layer or the electrode connection layer is generated. Therefore, it is possible to reliably prevent a short circuit between the charge generation layer and the first electrode, and a short circuit between the second electrode and the first electrode without forming a resistive layer. A display device and a light emitting device having high reliability, long life, high luminance, high efficiency, and high display quality can be manufactured without largely increasing the number of manufacturing steps. Note that effects described herein are merely illustrative, and are not restrictive. In addition, an additional effect may be present.

BRIEF DESCRIPTION OF DRAWINGS

FIG. 5A and FIG. 5B are conceptual diagrams of laminated structures in modified examples of the display device of Example 1 and the light emitting device of Example 4.

MODE FOR CARRYING OUT THE INVENTION

Figure 1:
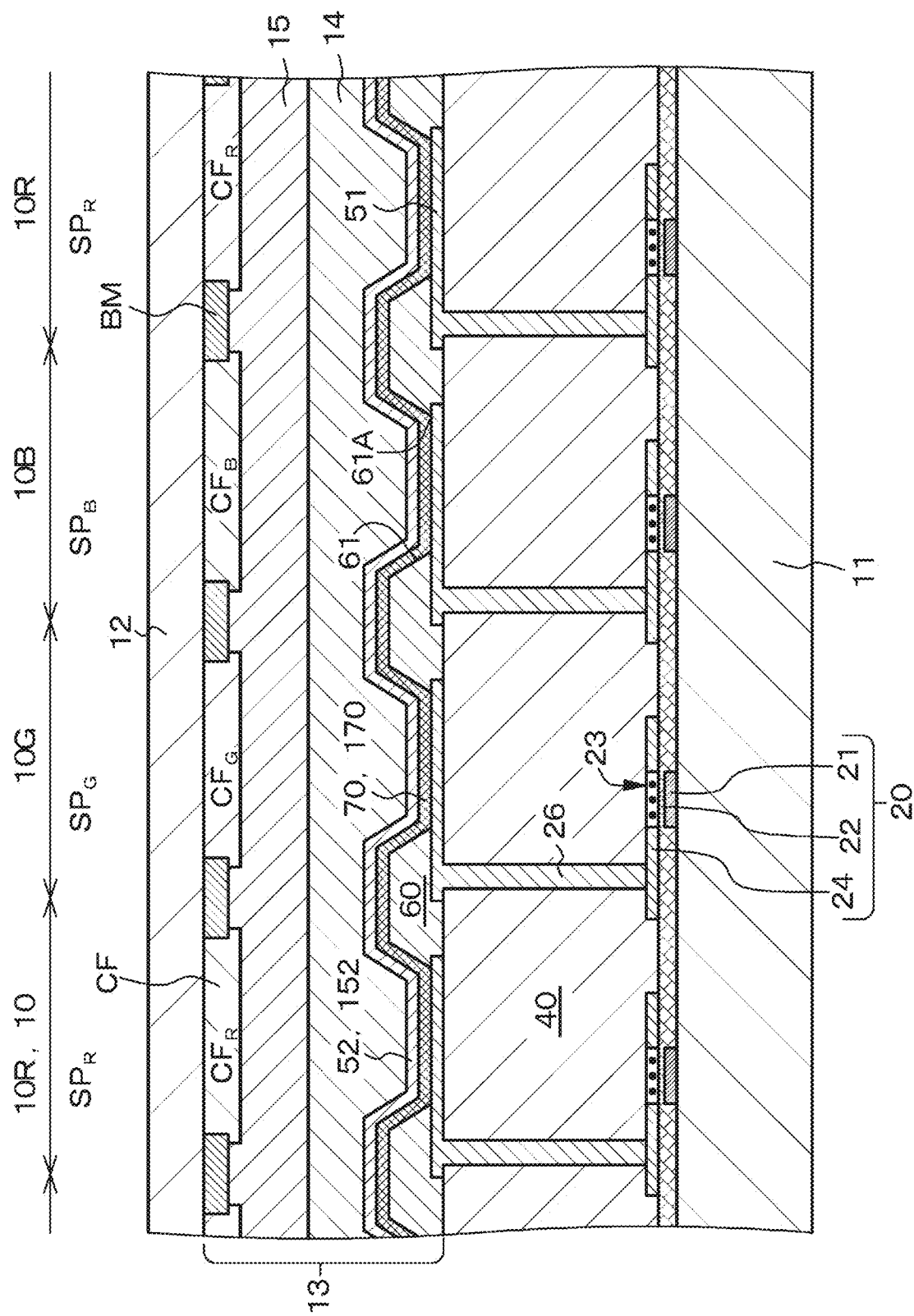
FIG. 1 is a schematic partial cross-sectional view of a display device of Example 1.

Hereinafter, the present disclosure will be described on the basis of Examples with reference to the drawings. However, the present disclosure is not limited to Examples, and various numerical values and materials in Examples are illustrative. Note that description will be made in the following order.

1. General description on display devices according to first and second aspects of the present disclosure and light emitting devices according to first and second aspects of the present disclosure 2. Example 1 (display device according to the first aspect of the present disclosure)

3. Example 2 (display device according to the second aspect of the present disclosure)

4. Example 3 (modifications of Examples 1 and 2)

5. Example 4 (light emitting devices according to the first and second aspects of the present disclosure)

6. Others

In the display device according to the first aspect of the present disclosure, a first electrode may constitute an anode electrode, a second electrode may constitute a cathode electrode, a first carrier may be an electron, a second carrier may be a hole, and a first layer constituting a charge generation layer may be constituted by a material containing an alkali metal or an alkaline earth metal. In addition, in this case, the first layer constituting the charge generation layer in a defect region may contain $CaO_XN_Y$ or $CsO_XN_Y$ (provided that $1<X<10$ and $1<Y<10$), and the composition of the first layer constituting the charge generation layer in a region other than the defect region may be different from that of the first layer constituting the charge generation layer in the defect region. The composition of the first layer constituting the charge generation layer in a region other than the defect region is a conductive composition.

In the display device according to the first aspect of the present disclosure including the above preferable form, the thickness of the charge generation layer in a region other than the defect region may be larger than that of the charge generation layer in the defect region. In this case, the thickness of the charge generation layer in the defect region is preferably 5 nm or more, and the thickness of the charge generation layer in a region other than the defect region is preferably 10 nm or more.

In the display device according to the first aspect of the present disclosure including various preferable forms described above, an electrode connection layer may be formed between the laminated structure and the second electrode or between the laminated structure and the first electrode. In a light emitting element including a defect region, the electrode connection layer may be in a high electrical resistance state or an insulated state in a defect region, while being in a low electrical resistance state in a region other than the defect region.

In the above preferable configuration in the display device according to the first aspect of the present disclosure or the display device according to the second aspect of the present disclosure, the electrode connection layer may be constituted by a material containing an alkali metal or an alkaline earth metal. In addition, in this case, the electrode connection layer in a defect region may include $CaO_XN_Y$ or $CsO_XN_Y$ (provided that $1<X<10$ and $1<Y<10$), and the composition of the electrode connection layer in a region other than the defect region may be different from that of the electrode connection layer in the defect region. The composition of the electrode connection layer in a region other than the defect region is a conductive composition. Furthermore, in these configurations in the display device according to the first aspect of the present disclosure or the display device according to the second aspect of the present disclosure including these configurations, the thickness of the electrode connection layer in a region other than the defect region may be larger than that of the electrode connection layer in the defect region. Furthermore, the thickness of the electrode connection layer in the defect region is preferably 5 nm or more, and the thickness of the electrode connection layer in a region other than the defect region is preferably 10 nm or more.

In the light emitting device according to the first aspect of the present disclosure, a first electrode may constitute an anode electrode, a second electrode may constitute a cathode electrode, a first carrier may be an electron, a second carrier may be a hole, and a first layer constituting a charge generation layer may be constituted by a material containing an alkali metal or an alkaline earth metal. In addition, in this case, the first layer constituting the charge generation layer in a defect region may contain $CaO_XN_Y$ or $CsO_XN_Y$ (provided that $1<X<10$ and $1<Y<10$), and the composition of the first layer constituting the charge generation layer in a region other than the defect region may be different from that of the first layer constituting the charge generation layer in the defect region. The composition of the first layer constituting the charge generation layer in a region other than the defect region is a conductive composition.

In the light emitting device according to the first aspect of the present disclosure including the above preferable form, the thickness of the charge generation layer in a region other than the defect region may be larger than that of the charge generation layer in the defect region. In this case, the thickness of the charge generation layer in the defect region is preferably 5 nm or more, and the thickness of the charge generation layer in a region other than the defect region is preferably 10 nm or more.

In the light emitting device according to the first aspect of the present disclosure including various preferable forms described above, an electrode connection layer may be formed between the laminated structure and the second electrode or between the laminated structure and the first electrode. The electrode connection layer may be in a high electrical resistance state or an insulated state in the defect region, while being in a low electrical resistance state in a region other than the defect region.

In the above preferable configuration in the light emitting device according to the first aspect of the present disclosure or the light emitting device according to the second aspect of the present disclosure, the electrode connection layer may be constituted by a material containing an alkali metal or an alkaline earth metal. In addition, in this case, the electrode connection layer in a defect region may include $CaO_XN_Y$ or $CsO_XN_Y$ (provided that $1<X<10$ and $1<Y<10$), and the composition of the electrode connection layer in a region other than the defect region may be different from that of the electrode connection layer in the defect region. The composition of the electrode connection layer in a region other than the defect region is a conductive composition. Furthermore, in these configurations in the light emitting device according to the first aspect of the present disclosure or the light emitting device according to the second aspect of the present disclosure including these configurations, the thickness of the electrode connection layer in a region other than the defect region may be larger than that of the electrode connection layer in the defect region. Furthermore, the thickness of the electrode connection layer in the defect region is preferably 5 nm or more, and the thickness of the electrode connection layer in a region other than the defect region is preferably 10 nm or more.

The display device or the light emitting device according to the first or second aspect of the present disclosure including various preferable forms and configurations described above may be collectively referred to simply as "the present disclosure". In addition, the display device or the light emitting device according to the first aspect of the present disclosure including various preferable forms and configurations described above may be collectively referred to as "the first aspect or the like of the present disclosure". The display device or the light emitting device according to the second aspect of the present disclosure including various preferable configurations described above may be collectively referred to as "the second aspect or the like of the present disclosure". Furthermore, the display device according to the first or second aspect of the present disclosure including various preferable forms and configurations described above may be collectively referred to as "the display device or the like of the present disclosure". The light emitting device according to the first or second aspect of the present disclosure including various preferable forms and configurations described above may be collectively referred to as "the light emitting device or the like of the present disclosure".

In the present disclosure, in a defect region, a laminated structure is in a discontinuous state and an organic layer is in a discontinuous state. Incidentally, the phrase "a laminated structure or an organic layer is in a discontinuous state" means that there is a continuous or discontinuous break in a part of a projected image of the laminated structure or the organic layer when the laminated structure or the organic layer is projected onto a substrate. Such a defect region is generated, for example, by presence of a particle (foreign matter) or a protrusion on a first electrode or formation of a break, a cut portion, or a chip in the first electrode for some reason. That is, the defect region refers to a region including a particle (foreign matter) and/or a protrusion present on the first electrode or a region including any one of a break, a cut portion, and a chip formed in the first electrode. Alternatively, the defect region refers to a region in which a laminated structure is in a nonuniform state in a lamination direction, a region in which an organic layer is in a nonuniform state in a thickness direction, or a region having no structure considered as a design. A region other than the defect region is a normal region, a region in which a laminated structure is in a uniform state in a lamination direction, a region in which an organic layer is in a uniform state in a thickness direction, and a region having a structure considered as a design. That is, in the defect region, the laminated structure is in a discontinuous state. Alternatively, in the defect region, the organic layer is in a discontinuous state. Alternatively, the defect region includes a particle present on the first electrode, a protrusion present on the first electrode, a break formed in the first electrode, a cut portion formed in the first electrode, or a chip formed in the first electrode. Alternatively, in the defect region, the laminated structure is nonuniform in a lamination direction. Alternatively, in the defect region, the organic layer is nonuniform in a thickness direction.

In the present disclosure, the charge generation layer or the electrode connection layer is in a high electrical resistance state or an insulated state in the defect region, while being in a low electrical resistance state in a region other than the defect region. The high electrical resistance state or the insulated state is defined as a state in which a value of a current flowing between the first electrode and the second electrode via the defect region is (largely) lower than a value of a current flowing between the first electrode and the second electrode via the organic layer. The low electrical resistance state is defined as a state in which a value of a current flowing between the first electrode and the second electrode via the defect region is close to or almost the same as a current flowing between the first electrode and the second electrode via the organic layer (that is, a kind of leak state). Alternatively, (value of electric resistivity in a high electrical resistance state or an insulated state)/value of electric resistivity in a low electrical resistance state)$\geq 1\times 10^2$ is satisfied.

In the present disclosure, the first layer constituting the charge generation layer (for example, a layer for supplying an electron as a first carrier) or the electrode connection layer in the defect region contains $CaO_XN_Y$ or $CsO_XN_Y$ (provided that $1<X<10$ and $1<Y<10$), but may further contain, as another atom or another composition, specifically an alkali metal or an alkaline earth metal, specifically, lithium (Li), sodium (Na), potassium (K), rubidium (Rb), strontium (Sr), barium (Ba), radium (Ra), and the like, and may contain beryllium (Be), magnesium (Mg), and the like. In addition, specific examples of the composition of the first layer constituting the charge generation layer or the electrode connection layer in a region other than the defect region include Ca, Li, Cs, $CaLiF_x$, $CsLiF_x$, CaLi, CsLi, and a composition in which a material constituting the organic layer and any of these compositions are mixed together. The second layer constituting the charge generation layer (for example, a layer for supplying a hole as a second carrier) contains a charge transfer complex typified by, for example, HAT6CN or the like. Alternatively, examples thereof include a conductive polymer such as polyaniline, polythiophene, polypyrrole, polyphenylenevinylene, polythienylenevinylene, polyquinoline, polyquinoxaline, a derivative thereof, or a polymer containing an aromatic amine structure in a main chain or a side chain (specifically, for example, oligoaniline and polydioxythiophene such as poly (3,4-ethylenedioxythiophene) (PEDOT)), metal phthalocyanine (copper phthalocyanine or the like), carbon and the like. The thickness of the charge generation layer or the electrode connection layer in a region other than the defect region is $1\times 10^{-9}$ m to $5\times 10^{-8}$ m, and the thickness of the charge generation layer or the electrode connection layer in the defect region is $1\times 10^{-9}$ m to $5\times 10^{-8}$ m.

Examples of a method for forming the charge generation layer or the electrode connection layer include a film formation method with a good coverage property. Specific examples thereof include an oblique vapor deposition method and vapor deposition with a plurality of vapor deposition sources at different positions. Alternatively, a coverage state can be improved by a film formation atmosphere or a heating condition while a film of the charge generation layer or the electrode connection layer is formed on the basis of a vapor deposition method. The coverage state can be improved by heating a film or causing a current to flow between the first electrode and the second electrode after film formation. The coverage state can be improved by controlling rectilinearity of vapor deposition particles by collimation.

Examples of a method for forming the organic layer include a physical vapor deposition method (PVD method) such as a vacuum vapor deposition method; a printing method such as a screen printing method or an inkjet printing method; a laser transfer method in which an organic layer on a laser absorption layer is separated by irradiating a laminated structure of the laser absorption layer and the organic layer formed on a transfer substrate with a laser and the organic layer is transferred; and various coating methods. In a case where the organic layer is formed on the basis of the vacuum vapor deposition method, for example, using a so-called metal mask, the organic layer can be obtained by depositing a material that has passed through an opening disposed in the metal mask, or the organic layer may be formed on the entire surface without patterning.

In the present disclosure, a substrate includes a first substrate, a driving circuit formed in the first substrate (or on the first substrate), and an interlayer insulation layer covering the first substrate and the driving circuit. The driving circuit drives a light emitting element and a light emitting portion. The first electrode is formed on the interlayer insulation layer, and the driving circuit is connected to the first electrode via a contact hole formed in the interlayer insulation layer. A second substrate is disposed above the light emitting element or the light emitting portion. For example, a protective film and a sealing layer are formed between the second electrode and the second substrate.

In the present disclosure, a top emission type display device or light emitting device that emits light from the second substrate or a bottom emission type display device or light emitting device that emits light from the first substrate may be used. In addition, the display device or the like of the present disclosure includes a plurality of light emitting elements, and each of the light emitting elements constitutes a sub-pixel or a pixel. The light emitting element or the light emitting portion can be constituted by an organic EL element.

Incidentally, in a case where the second aspect or the like of the present disclosure adopts the top emission type, it is only required to form an electrode connection layer between the laminated structure or the organic layer and the second electrode. In addition, in a case where the second aspect or the like of the present disclosure adopts the bottom emission type, it is only required to form an electrode connection layer between the laminated structure or the organic layer and the first electrode.

In the first aspect or the like of the present disclosure, the laminated structure is constituted by at least two organic layers that emit different colors. In this case, light emitted from the organic layer may be white. Specifically, the laminated structure may have three layers of a red light emitting organic layer that emits red light (wavelength: 620 nm to 750 nm), a green light emitting organic layer that emits green light (wavelength: 495 nm to 570 nm), and a blue light emitting organic layer that emits blue light (wavelength: 450 nm to 495 nm), and emits white light as a whole. A charge generation layer is formed between the red light emitting organic layer and the green light emitting organic layer, and a charge generation layer is also formed between the green light emitting organic layer and the blue light emitting organic layer. Alternatively, the laminated structure may have two layers of a blue light emitting organic layer that emits blue light and a yellow light emitting organic layer that emits yellow light, and emits white light as a whole. A charge generation layer is formed between the blue light emitting organic layer and the yellow light emitting organic layer. Alternatively, the laminated structure may have two layers of a blue light emitting organic layer that emits blue light and an orange light emitting organic layer that emits orange light, and emits white light as a whole. A charge generation layer is formed between the blue light emitting organic layer and the orange light emitting organic layer.

In addition, in the display device according to the first aspect of the present disclosure, such a white light emitting element that emits white light includes a red color filter layer to constitute a red light emitting element, the white light emitting element includes a green color filter layer to constitute a green light emitting element, and the white light emitting element includes a blue color filter layer to constitute a blue light emitting element. One pixel is constituted by a red light emitting element, a green light emitting element, and a blue light emitting element. In some cases, one pixel may be constituted by a red light emitting element, a green light emitting element, a blue light emitting element, and a light emitting element that emits white light (or a light emitting element that emits complementary color light).

Alternatively, in the first aspect or the like of the present disclosure, the laminated structure may have at least two organic layers that emit light of the same color. That is, the first organic layer and the second organic layer may have the same configuration.

In the display device according to the second aspect of the present disclosure, one pixel may be constituted by three sub-pixels (light emitting elements) of a sub-pixel having a red light emitting organic layer and constituted by a light emitting element that emits red light, a sub-pixel having a green light emitting organic layer and constituted by a light emitting element that emits green light, and a sub-pixel having a blue light emitting organic layer and constituted by a light emitting element that emits blue light. Alternatively, one pixel may be constituted by four sub-pixels (light emitting elements) of these three sub-pixels and a sub-pixel constituted by a light emitting element that emits white light (or a light emitting element that emits complementary color light).

The organic layer includes a light emitting layer including an organic light emitting material. Specifically, for example, the organic layer may be constituted by a laminated structure of a hole transport layer, a light emitting layer, and an electron transport layer, a laminated structure of a hole transport layer and a light emitting layer serving also as an electron transport layer, a laminated structure of a hole injection layer, a hole transport layer, a light emitting layer, an electron transport layer, and an electron injection layer or the like. The light emitting element or the light emitting portion includes a single organic layer that emits a single color (the second aspect or the like of the present disclosure) or a plurality of organic layers that emits a plurality of colors or a single color (the first aspect or the like of the present disclosure). In addition, in the latter case, for example, a laminated structure or a light emitting portion that emits white light as a whole can be obtained. However, there is a case where it cannot be clearly recognized that a light emitting layer is constituted by a plurality of light emitting layers.

As described above, an insulating or conductive protective film is preferably disposed on the second electrode, that is, between the second electrode and the sealing layer in order to prevent moisture from reaching the organic layer. The protective film is preferably formed particularly on the basis of a film formation method in which the energy of film formation particles is small, such as a vacuum vapor deposition method, or a film formation method such as a CVD method or an MOCVD method because an influence on a base can be reduced. Alternatively, in order to prevent reduction in brightness due to deterioration of the organic layer, a film formation temperature is desirably set to room temperature. Furthermore, in order to prevent peeling of the protective film, the protective film is desirably formed under a condition minimizing a stress of the protective film. In addition, the protective film is preferably formed without exposure of an already formed electrode to the atmosphere. As a result, deterioration of the organic layer due to moisture or oxygen in the atmosphere can be prevented. Furthermore, in the top emission type, the protective film is desirably constituted by a material that transmits light generated in the organic layer by, for example, 80% or more. Specific examples of the material include an inorganic amorphous insulating material such as the following materials. Such an inorganic amorphous insulating material does not generate grains, and therefore has low water permeability and constitutes a good protective film. Specifically, as a material constituting the protective film, a material that is transparent to light emitted from the light emitting layer, is dense, and does not transmit moisture is preferably used. More specific examples of the material include amorphous silicon ($\alpha$-Si), amorphous silicon carbide ($\alpha$-SiC), amorphous silicon nitride ($\alpha$-Si$_{1-x}$N$_x$), amorphous silicon oxide ($\alpha$-Si$_{1-y}$O$_y$), amorphous carbon ($\alpha$-C), amorphous silicon oxide/nitride ($\alpha$-SiON), and Al$_2$O$_3$. In a case where the protective film is constituted by a conductive material, the protective film is only required to be constituted by a transparent conductive material such as ITO or IZO.

As described above, the protective film and the second substrate are joined by the sealing layer. Examples of a material constituting the sealing layer include a thermosetting adhesive such as an acrylic adhesive, an epoxy-based adhesive, a urethane-based adhesive, a silicone-based adhesive, or a cyanoacrylate-based adhesive, and an ultraviolet curable adhesive.

In the top emission type display device, a color filter layer may be formed between the sealing layer and the second substrate. The bottom emission type display device may adopt an on-chip color filter (OCCF) structure in which a color filter layer is disposed on the first substrate. The color filter layer is constituted by a resin to which a coloring agent containing a desired pigment or dye is added. By selecting a pigment or a dye, adjustment is performed such that light transmittance in a target wavelength range of red, green, blue, or the like is high, and light transmittance in the other wavelength ranges is low. For a light emitting element that emits white light, it is only required to dispose a transparent filter layer. A light shielding layer (black matrix layer) may be formed between a color filter and a color filter. For example, the light shielding layer is constituted by a black resin film (specifically, including a black polyimide resin, for example) having an optical density of 1 or more, mixed with a black coloring agent, or a thin film filter using interference of a thin film. The thin film filter is formed by laminating two or more thin films including metal, metal nitride, or metal oxide, for example, and attenuates light by utilizing interference of a thin film. Specific examples of the thin film filter include a thin film filter obtained by alternately laminating Cr and chromium(III) oxide ($Cr_2O_3$).

As described above, for example, the first electrode is disposed on the interlayer insulation layer. In addition, this interlayer insulation layer covers a driving circuit formed on the first substrate (or in the first substrate). The driving circuit is constituted by one or more transistors (for example, MOSFETs or TFTs). The transistors are electrically connected to the first electrode via a contact hole (contact plug) disposed in the interlayer insulation layer. The driving circuit can have a known circuit configuration. As a constituent material of the interlayer insulation layer, an $SiO_2$-based material such as $SiO_2$, BPSG, PSG, BSG, AsSG, PbSG, SOG (spin on glass), low melting point glass, or glass paste; an SiN-based material including an SiON-based material; or an insulating resin such as an acrylic resin or a polyimide resin can be used singly or in combination thereof appropriately. For forming the interlayer insulation layer, a known process such as a CVD method, a coating method, a sputtering method, or various printing methods can be used.

A structure may be adopted in which an insulation layer is formed on the interlayer insulation layer and the first electrode, an opening is formed in the insulation layer on the first electrode, and the first electrode is exposed to a bottom of the opening. The organic layer is formed over the insulation layer from above the first electrode exposed to a bottom of the opening. Alternatively, the insulation layer may be formed on the interlayer insulation layer exposed between the first electrode and the first electrode. The organic layer is formed over the insulation layer from above the first electrode. The insulation layer may be constituted by a material constituting the above interlayer insulation layer. The material constituting the insulation layer and the material constituting the interlayer insulation layer may be the same as or different from each other.

The first substrate or the second substrate may be constituted by a high strain point glass substrate, a soda glass ($Na_2O.CaO.SiO_2$) substrate, a borosilicate glass ($Na_2O.B_2O_3.SiO_2$) substrate, a forsterite ($2MgO.SiO_2$) substrate, a lead glass ($Na_2O.PbO.SiO_2$) substrate, various glass substrates each having an insulating film formed on a surface thereof, a quartz substrate, a quartz substrate having an insulating film formed on a surface thereof, a silicon semiconductor substrate, or an organic polymer such as polymethyl methacrylate (PMMA), polyvinyl alcohol (PVA), polyvinyl phenol (PVP), polyether sulfone (PES), polyimide, polycarbonate, or polyethylene terephthalate (PET) (having a form of a polymer material such as a plastic film, a plastic sheet, or a plastic substrate constituted by a polymer material and having flexibility). Materials constituting the first substrate and the second substrate may be the same as or different from each other. However, in a case where light is emitted via the second substrate, the second substrate is required to be transparent with respect to light from a light emitting element or the like. In a case where light is emitted via the first substrate, the first substrate is required to be transparent with respect to light from a light emitting element or the like.

In the present disclosure, it is only required to cause the first electrode to function as an anode electrode in a case where the top emission type is adopted, and it is only required to cause the second electrode to function as an anode electrode in a case where the bottom emission type is adopted. In addition, in a case where the first electrode or the second electrode is caused to function as an anode electrode, examples of a material constituting the first or second electrode include aluminum (Al) and an alloy containing aluminum, and a metal having a high work function, such as platinum (Pt), gold (Au), silver (Ag), chromium (Cr), molybdenum (Mo), titanium (Ti), tungsten (W), nickel (Ni), copper (Cu), iron (Fe), cobalt (Co), or tantalum (Ta), or an alloy thereof (for example, an Ag—Pd—Cu alloy containing silver as a main component and containing 0.3% by mass to 1% by mass of palladium (Pd) and 0.3% by mass to 1% by mass of copper (Cu), an Al—Nd alloy, or an Al—Ni alloy). The thickness of the anode electrode may be 0.1 μm to 1 μm, for example. Alternatively, the material constituting the first or second electrode may be a transparent conductive material having excellent hole injection characteristics, such as an oxide of indium and tin (ITO) or an oxide of indium and zinc (IZO), or may have a structure obtained by laminating a transparent conductive material having excellent hole injection characteristics, such as an oxide of indium and tin (ITO) or an oxide of indium and zinc (IZO) on a dielectric multilayer film or a reflective film having high light reflectivity, including aluminum (Al) or the like.

Meanwhile, it is only required to cause the second electrode to function as a cathode electrode in a case where the top emission type is adopted, and it is only required to cause the first electrode to function as a cathode electrode in a case where the bottom emission type is adopted. Light is emitted to an outside via the cathode electrode. In addition, in a case where the first electrode or the second electrode is caused to function as a cathode electrode, the first electrode or the second electrode is desirably constituted by a conductive material (a semi-light transmitting material or a light transmitting material) having a small work function value so as to be able to transmit emitted light and inject an electron into an organic layer efficiently. Examples thereof include a metal having a small work function and an alloy thereof, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], an alloy of magnesium-calcium (Mg—Ca alloy), or an alloy of aluminum (Al) and lithium (Li) (Al—Li alloy). Among these metals and alloys, an Mg—Ag alloy is preferable, and a volume ratio between magnesium and silver may be Mg:Ag=5:1 to 30:1, for example. Alternatively, as a volume ratio between magnesium and calcium may be Mg:Ca=2:1 to 10:1, for example. The thickness of the cathode electrode may be 4 nm to 50 nm, preferably 4 nm to 20 nm, and more preferably 6 nm to 12 nm, for example. A bus electrode (auxiliary electrode) including a low resistance material such as aluminum, an aluminum alloy, silver, a silver alloy, copper, a copper alloy, gold, or a gold alloy may be disposed in the cathode electrode to reduce resistance as the whole cathode electrode.

In addition, in the second aspect or the like of the present disclosure, the cathode electrode may be constituted by a so-called transparent electrode (for example, thickness: $3\times10^{-8}$ m to $1\times10^{-6}$ m) including indium oxide, indium-tin oxide (ITO, including Sn-doped $In_2O_3$, crystalline ITO, and amorphous ITO), indium zinc oxide (IZO), indium-gallium oxide (IGO), indium-doped gallium-zinc oxide (IGZO, In—GaZnO$_4$), IFO (F-doped $In_2O_3$)], ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), or the like. As described above, in a case where the second aspect or the like of the present disclosure adopts the top emission type, it is only required to form an electrode connection layer between the laminated structure or the organic layer and the second electrode (cathode electrode). In addition, in a case where the second aspect or the like of the present disclosure adopts the bottom emission type, it is only required to form an electrode connection layer between the laminated structure or the organic layer and the first electrode (cathode electrode).

Examples of a method for forming the first electrode or the second electrode include a combination of a vapor deposition method including an electron beam vapor deposition method, a hot filament vapor deposition method, and a vacuum vapor deposition method, a sputtering method, a chemical vapor deposition method (CVD method), an MOCVD method, and an ion plating method with an etching method; various printing methods such as a screen printing method, an inkjet printing method, and a metal mask printing method; a plating method (an electroplating method or an electroless plating method); a lift-off method; a laser ablation method; and a sol-gel method. According to various printing methods and a plating method, the first electrode or the second electrode having a desired shape (pattern) can be formed directly. Note that, in a case where the second electrode is formed after the organic layer is formed, the second electrode is preferably formed particularly on the basis of a film formation method in which energy of film formation particles is small, such as a vacuum vapor deposition method, or a film formation method such as an MOCVD method from a viewpoint of preventing the organic layer from being damaged. When the organic layer is damaged, non-light emitting pixels (or non-light emitting sub-pixels) called "dark spots" due to generation of a leak current may be generated. In addition, processes from formation of the organic layer to formation of these electrodes are preferably performed without exposure thereof to the atmosphere from a viewpoint of preventing deterioration of the organic layer due to moisture in the atmosphere. In the display device or the like of the present disclosure, in some cases, either one of the first electrode and the second electrode does not have to be patterned, and can be a so-called common electrode. In principle, patterning of the first electrode and the second electrode is unnecessary in the light emitting device or the like of the present disclosure.

In the present disclosure, a resonator structure may be included in order to further improve a light extraction efficiency. Specifically, light emitted from a light emitting layer may be caused to resonate between a first interface constituted by an interface between the anode electrode (or a light reflecting layer disposed via the interlayer insulation film below the anode electrode in a case where the top emission type is adopted or above the anode electrode in a case where the bottom emission type is adopted) and the organic layer and a second interface constituted by an interface between the cathode electrode and the organic layer, and a part of the light may be emitted from the cathode electrode. In addition, if a distance from a maximum emission position of the light emitting layer to the first interface is represented by $L_1$, an optical distance thereof is represented by $OL_1$, a distance from the maximum emission position of the light emitting layer to the second interface is represented by $L_2$, an optical distance thereof is represented by $OL_2$, and $m_1$ and $m_2$ each represent an integer, the following formulas (1-1), (1-2), (1-3), and (1-4) are satisfied.

$$0.7\{-\Phi_1/(2\pi)+m_1\}\leq 2\times OL_1/\lambda \leq 1.2\{-\Phi_1/(2\pi)+m_1\} \quad (1\text{-}1)$$

$$0.7\{-\Phi_2/(2\pi)+m_2\}\leq 2\times OL_2/\lambda \leq 1.2\{-\Phi_2/(2\pi)+m_2\} \quad (1\text{-}2)$$

$$L_1<L_2 \quad (1\text{-}3)$$

$$m_1<m_2 \quad (1\text{-}4)$$

Herein, $\lambda$: Maximum peak wavelength of spectrum of light generated in light emitting layer (or desired wavelength among wavelengths of light generated in light emitting layer)

$\Phi_1$: Phase shift amount (unit: radian) of light reflected on first interface Provided that $-2\pi<\Phi_1\leq 0$ is satisfied.

$\Phi_2$: Phase shift amount (unit: radian) of light reflected on second interface Provided that $-2\pi<\Phi_2\leq 0$ is satisfied.

Herein, $m_1=0$ and $m_2=1$ that can maximize a light extraction efficiency can be satisfied.

Note that the distance $L_1$ from the maximum emission position of the light emitting layer to the first interface means an actual distance (physical distance) from the maximum emission position of the light emitting layer to the first interface and the distance $L_2$ from the maximum emission position of the light emitting layer to the second interface means an actual distance (physical distance) from the maximum emission position of the light emitting layer to the second interface. In addition, the optical distance is also called an optical path length, and generally means n×L when a light ray passes through a medium having a refractive index n for a distance L. The same applies to the following description. Therefore, if an average refractive index of the organic layer (or organic layer and interlayer insulation film) is represented by $n_{ave}$, there is a relationship of $$OL_1=L_1\times n_{ave} \text{ and}$$

$$OL_2=L_2\times n_{ave}.$$

Herein, the average refractive index $n_{ave}$ is obtained by summing up a product of the refractive index and the thickness of each layer constituting the organic layer (or the organic layer and the interlayer insulation film), and dividing the resulting sum by the thickness of the organic layer (or the organic layer and the interlayer insulation film).

The first electrode, the second electrode, and the light reflecting layer absorb a part of incident light and reflect the rest. Therefore, a phase shift occurs in the reflected light. The phase shift amounts $\Phi_1$ and $\Phi_2$ can be determined by measuring values of a real number part and an imaginary number part of a complex refractive index of a material constituting the first electrode, the second electrode, and the light reflecting layer, for example, using an ellipsometer, and performing calculation based on these values (refer to, for example, "Principles of Optic", Max Born and Emil Wolf, 1974 (PERGAMON PRESS)). Note that the refractive index of the organic layer, the interlayer insulation film, or the like can also be determined by measurement with an ellipsometer.

As described above, in an organic EL display device having a resonator structure, actually, a red light emitting element constituted by inclusion of a red color filter layer in a white light emitting element causes red light emitted from the light emitting layer to resonate, and emits reddish light (light having a light spectrum peak in a red region) from the cathode electrode. In addition, the green light emitting element constituted by inclusion of a green color filter layer in a white light emitting element causes green light emitted from the light emitting layer to resonate, and emits greenish light (light having a light spectrum peak in a green region) from the cathode electrode. Furthermore, the blue light emitting element constituted by inclusion of a blue color filter layer in a white light emitting element causes blue light emitted from the light emitting layer to resonate, and emits blueish light (light having a light spectrum peak in a blue region) from the cathode electrode. That is, it is only required to design each of the light emitting elements by determining a desired wavelength $\lambda$ (specifically, wavelengths of red light, green light, and blue light) among wavelengths of light generated in the light emitting layer and determining various parameters such as $OL_1$ and $OL_2$ in each of the red light emitting element, the green light emitting element, and the blue light emitting element on the basis of formulas (1-2), (1-2), (1-3), and (1-4).

Examples of a material constituting the light reflecting layer include aluminum, an aluminum alloy (for example, Al—Nd), a Ti/Al laminated structure, chromium (Cr), silver (Ag), and a silver alloy (for example, Ag—Pd—Cu or Ag—Sm—Cu). The light reflecting layer can be formed, for example, by a vapor deposition method including an electron beam vapor deposition method, a hot filament vapor deposition method, and a vacuum vapor deposition method, a sputtering method, a CVD method, and an ion plating method; a plating method (an electroplating method or an electroless plating method); a lift-off method; a laser ablation method; a sol-gel method or the like.

The interlayer insulating film may be constituted, for example, by a material constituting the above interlayer insulation layer.

In an organic EL display device, the thickness of a hole transport layer (hole supply layer) and the thickness of an electron transport layer (electron supply layer) are desirably substantially equal to each other. Alternatively, the thickness of the electron transport layer (electron supply layer) may be larger than that of the hole transport layer (hole supply layer). As a result, an electron can be supplied sufficiently to the light emitting layer in an amount necessary for a high efficiency at a low driving voltage. That is, by disposing a hole transport layer between the anode electrode and the light emitting layer, and forming the hole transport layer with a film having a film thickness smaller than the electron transport layer, supply of holes can be increased. In addition, this makes it possible to obtain a carrier balance with no excess or deficiency of holes and electrons and a sufficiently large carrier supply amount. Therefore, a high emission efficiency can be obtained. In addition, due to no excess or deficiency of holes and electrons, the carrier balance hardly collapses, drive deterioration is suppressed, and an emission lifetime can be prolonged.

In the display device or the like of the present disclosure, in a form in which one pixel (or sub-pixel) is constituted by one light emitting element (display element), examples of arrangement of a pixel (or sub-pixel) include stripe arrangement, diagonal arrangement, delta arrangement, and rectangle arrangement although not being limited thereto. In addition, in a form in which one pixel (or sub-pixel) is constituted by assembly of a plurality of light emitting elements (display elements), examples of arrangement of a pixel (or sub-pixel) include stripe arrangement although not being limited thereto.

On an outermost light emitting surface of the display device or the light emitting device (outer surface of the first substrate or the second substrate), an ultraviolet absorbing layer, a contamination preventing layer, a hard coat layer, or an antistatic layer may be formed, or a protective member may be disposed.

The display device or the like of the present disclosure can be used, for example, as a monitor device constituting a personal computer, or a monitor device incorporated in a television receiver, a mobile phone, a personal digital assistant (PDA), or a game machine. Alternatively, the display device or the like of the present disclosure can be applied to an electronic view finder (EVF) or a head mounted display (HMD). Alternatively, the display device or the like of the present disclosure can constitute electronic paper such as an electronic book or electronic newspaper, a bulletin board such as a signboard, a poster, or a blackboard, rewritable paper substituted for printer paper, a display unit of a home appliance, a card display unit of a point card or the like, an electronic advertisement, or an image display device in an electronic POP. The light emitting device of the present disclosure can constitute various lighting devices including a backlight device for a liquid crystal display device and a planar light source device.

EXAMPLE 1

Figure 2:
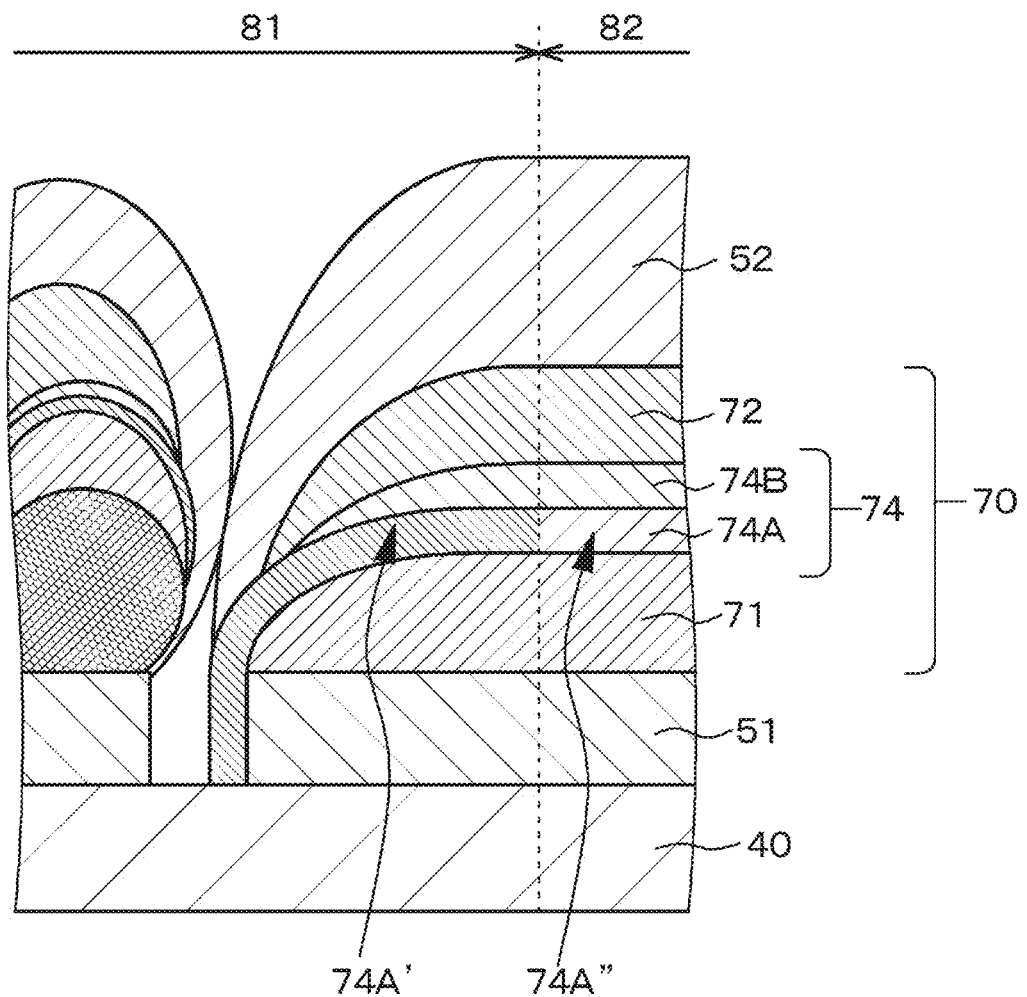
FIG. 2 is a schematic partial cross-sectional view enlarging a light emitting element including a defect region and a normal region in the display device of Example 1.
Figure 3:
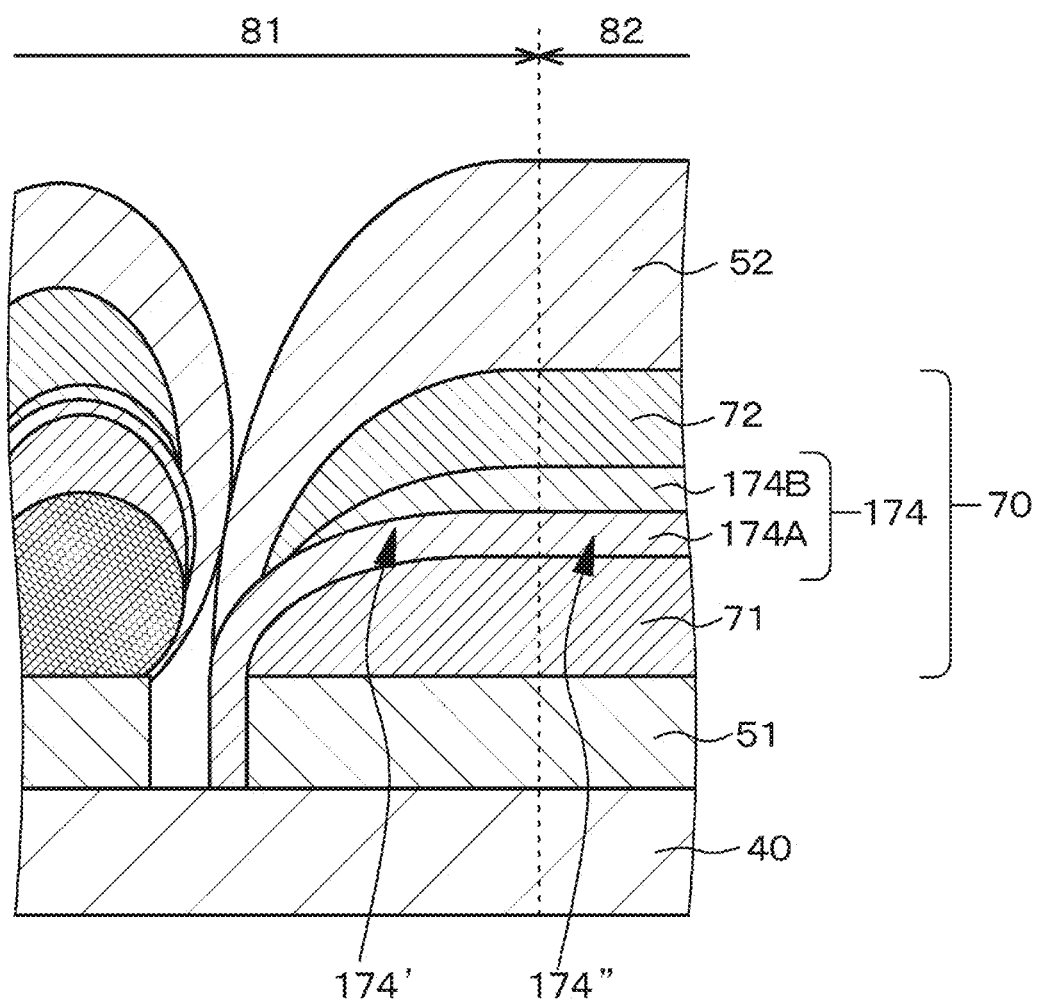
FIG. 3 is a schematic partial cross-sectional view enlarging a light emitting element including a defect region and a normal region in a conventional display device.
Figure 4A:
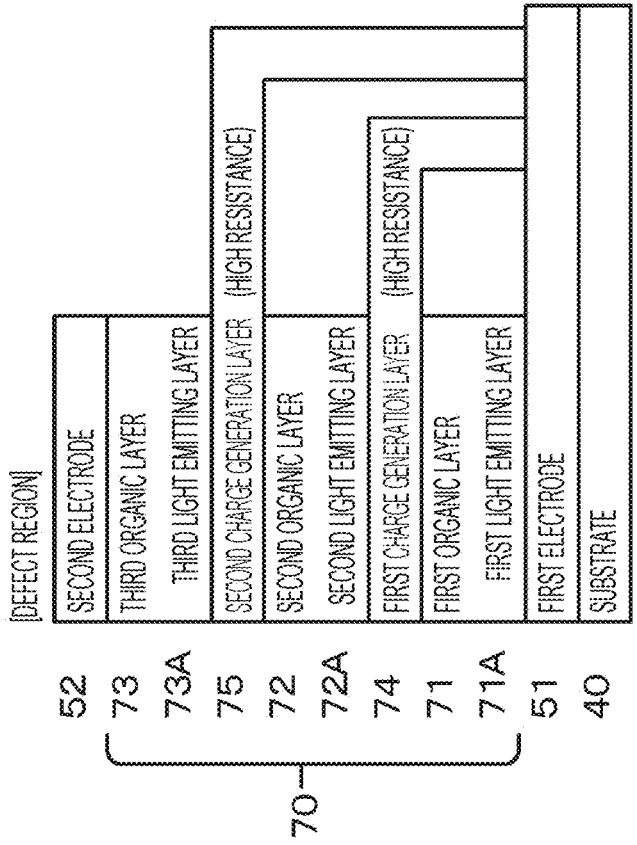
FIG. 4A and FIG. 4B are conceptual diagrams of laminated structures in the display device of Example 1 and a light emitting device of Example 4.
Figure 4B:
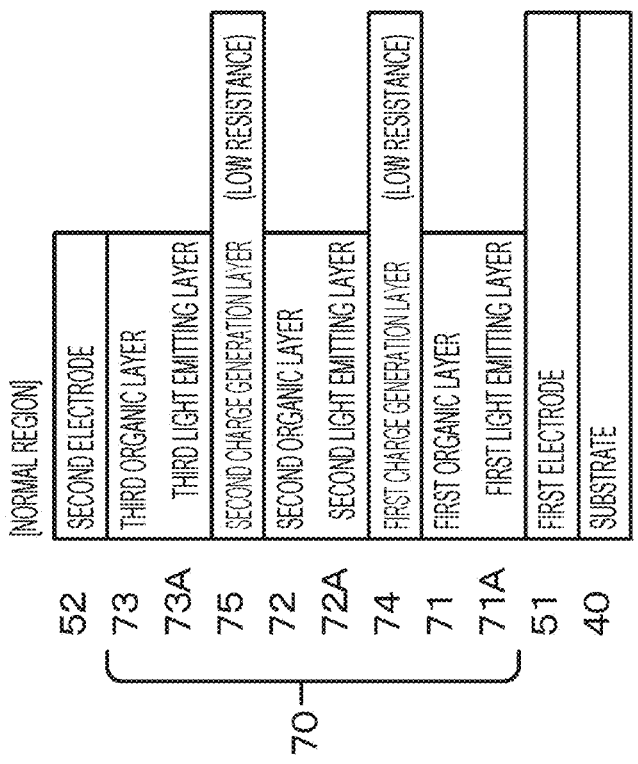

Example 1 relates to a display device (specifically, organic EL display device) according to the first aspect of the present disclosure. FIG. 1 illustrates a schematic partial cross-sectional view of the display device of Example 1. In addition, FIG. 2 illustrates a schematic partial cross-sectional view enlarging a light emitting element including a defect region and a normal region in the display device of Example 1, and FIG. 3 illustrates a schematic partial cross-sectional view enlarging a light emitting element including a defect region and a normal region in a conventional display device. Furthermore, FIG. 4A and FIG. 4B illustrate conceptual diagrams of laminated structures. FIG. 1 illustrates only a light emitting element including no defect region. The display device of Example 1 or the display device of Example 2 or 3 described below is an active matrix type display device of color display, and is a top emission type display device. That is, light is emitted via the second substrate.

The display device of Example 1 is a display device having light emitting elements (specifically, organic EL elements) 10 arranged in a two-dimensional matrix. In addition, each of the light emitting elements 10 includes (A) a first electrode 51 formed on a substrate, (B) a laminated structure 70 formed on the first electrode 51, and (C) a second electrode 52 formed on the laminated structure 70.

Specifically, the display device of Example 1 or a display device of Example 2 or 3 described below includes a first substrate 11, a second substrate 12, and a plurality of light emitting elements (display elements) 10 located between the first substrate 11 and the second substrate 12 and arranged in a two-dimensional matrix, and emits light via the second substrate 12. Alternatively, in another expression, the display device of Example 1 or the display device of Example 2 or 3 described below includes the first substrate 11, the second substrate 12, and an image display unit 13 sandwiched by the first substrate 11 and the second substrate 12. In the image display unit 13, the plurality of light emitting elements 10 is arranged in a two-dimensional matrix. Organic EL elements which are light emitting elements are arranged in a two-dimensional matrix in a first direction and a second direction extending in a direction orthogonal to the first direction.

In addition, in the display device of Example 1, the laminated structure 70 is formed by laminating:

in the following order from the first electrode 51 side, at least (B-1) a first organic layer 71 including a first light emitting layer 71A containing an organic light emitting material;

(B-2) a charge generation layer 74 in which a first layer 74A into which a first carrier is injected and a second layer 74B into which a second carrier is injected are laminated; and (B-3) a second organic layer 72 including a second light emitting layer 72A containing an organic light emitting material. By disposing the charge generation layer, the light emitting layer can emit light more efficiently.

Incidentally, in the display device of Example 1, the laminated structure 70 is more specifically formed by laminating:

in the following order from the first electrode 51 side, the first organic layer 71 including the first light emitting layer 71A containing an organic light emitting material;

the first charge generation layer 74 in which the first layer 74A into which a first carrier is injected and the second layer 74B into which a second carrier is injected are laminated;

the second organic layer 72 including the second light emitting layer 72A containing an organic light emitting material;

a second charge generation layer 75 in which a first layer 75A into which a first carrier is injected and a second layer 75B into which a second carrier is injected are laminated; and a third organic layer 73 including a third light emitting layer 73A containing an organic light emitting material.

In the following description, the charge generation layer may be simply referred to as "charge generation layer 74" for description on the basis of the first charge generation layer 74. However, the second charge generation layer 75 also has the same configuration and structure as the first charge generation layer 74. In addition, in FIGS. 2 and 3, the second charge generation layer 75 and the third organic layer 73 are not illustrated for simplification of the drawing.

In the display device of Example 1 or the display device of Example 2 or 3 described below, a protective film 14 and a sealing layer (sealing resin layer) 15 are disposed above the second electrode 52, that is, between the second electrode 52 and the second substrate 12. The insulating or conductive protective film 14 is disposed in order to prevent moisture from reaching the laminated structure 70 or an organic layer 170 described below, and specifically contains an $SiO_2$-based material or an SiN-based material, for example. The protective film 14 is bonded to the second substrate 12 via the sealing layer (sealing resin layer) 15 including, for example, an acrylic adhesive or an epoxy-based adhesive. A color filter layer CF is formed between the sealing layer 15 and the second substrate 12. A light shielding layer (black matrix layer) BM is formed between a color filter layer CF and a color filter layer CF. The color filter layer CF and the light shielding layer BM are formed in contact with the second substrate 12.

In addition, in the display device of Example 1, as illustrated in FIG. 2, in a defect region 81, the laminated structure 70 is in a discontinuous state or in a nonuniform state in a lamination direction. In addition, in a light emitting element including the defect region 81, the charge generation layer 74 is in a high electrical resistance state or an insulated state in the defect region 81, while being in a low electrical resistance state in a region other than the defect region 81 (region in which the laminated structure 70 is in a uniform state in a lamination direction, referred to as a "normal region 82"). Specifically, the first layer 74A of the charge generation layer 74 in the defect region 81 is in a high electrical resistance state or an insulating state, and this region of the first layer 74A is indicated by reference numeral 74A'. In addition, the region of the first layer 74A in a low electrical resistance state in the normal region 82 is indicated by reference numeral 74A". The first layer 74A (region 74A') of the charge generation layer 74 in the defect region 81 extends to the first electrode 51.

Meanwhile, in a conventional display device, as illustrated in FIG. 3, in a light emitting element including the defect region 81 in which the laminated structure 70 is in a discontinuous state or in a nonuniform state in a lamination direction, a charge generation layer 174 including a first layer containing $LiF_y$ having conductivity extends to the first electrode 51, and a short circuit occurs between the charge generation layer 174 and the first electrode 51. Note that a first layer 174A of the charge generation layer 174 in the defect region 81 is in a low electrical resistance state, and this region of the first layer 174A is indicated by reference numeral 174A'. In addition, the region of the first layer 174A in a low electrical resistance state in the normal region 82 is indicated by reference numeral 174A". Such a short circuit caused between the charge generation layer 174 and the first electrode 51 causes deterioration of an image quality, such as color unevenness or color shift, as described above.

In the display device of Example 1, the first electrode 51 constitutes an anode electrode and the second electrode 52 constitutes a cathode electrode. In addition, the first carrier is an electron and the second carrier is a hole. In addition, the first layer (for example, a layer for supplying an electron as the first carrier) 74A constituting the charge generation layer 74 is constituted by a material containing an alkali metal or an alkaline earth metal. Specifically, the first layer (region 74A') constituting the charge generation layer 74 in the defect region 81 contains $CaO_xN_y$ or $CsO_xN_y$ (provided that $1<X<10$ and $1<Y<10$). Meanwhile, the composition of the first layer (region 74A") constituting the charge generation layer 74 in a region (normal region 82) other than the defect region 81 is different from that of the first layer (region 74A') constituting the charge generation layer 74 in the defect region 81. More specifically, in Example 1, the first layer (region 74A") contains a material in which $CaLiF_x$ and a material constituting the organic layer are mixed together, and is a conductive composition. Meanwhile, the first layer (region 74A') contains $CaO_xN_y$, further contains a substance constituting the first layer (region 74A'), and is in a high resistance state or in an insulated state as a whole due to presence of $CaO_xN_y$. The second layer 74B (for example, a layer for supplying a hole as the second carrier) constituting the charge generation layer 74 includes HAT6CN.

Furthermore, the thickness of the charge generation layer 74 in a region (normal region 82) other than the defect region 81 is larger than that of the charge generation layer 74 in the defect region 81. Specifically, the thickness of the charge generation layer 74 in the defect region 81 is 5 nm or more, and the thickness of the charge generation layer 74 in a region (normal region 82) other than the defect region 81 is 10 nm or more (more specifically, for example, 20 nm).

In the display device of Example 1, one pixel is constituted by three sub-pixels (three light emitting elements) of a red display sub-pixel $SP_R$ (red light emitting element 10R), a green display sub-pixel $SP_G$ (green light emitting element 10G), and a blue display sub-pixel $SP_B$ (blue light emitting element 10B). The second substrate 12 includes color filter layers $CF_R$, $CF_G$, and $CF_B$. Each color light emitting sub-pixel is constituted by a light emitting element (organic EL element) that emits white light and includes the color filter layers $CF_R$, $CF_G$, and $CF_B$. That is, the laminated structure 70 itself emits white light as a whole. The red light emitting element (red display element) 10R, the green light emitting element (green display element) 10G, and the blue light emitting element (blue display element) 10B have the same configuration and structure except for the color filter layer CF. In addition, as described above, the light shielding layer (black matrix layer) BM is disposed between the color filter layer CF and the color filter layer CF. The number of pixels is, for example, 1920×1080. One of the light emitting elements 10 constitutes one sub-pixel, and the number of light emitting elements (specifically, organic EL elements) 10 is three times the number of pixels.

In the display device of Example 1 or the display device of Example 2 or 3 described below, the first electrode 51 functions as an anode electrode, and the second electrode 52 functions as a cathode electrode. Each of the first substrate 11 and the second substrate 12 contains a glass substrate. The first electrode 51 is formed on the basis of a combination of a vacuum vapor deposition method and an etching method. A film of the second electrode 52 is formed particularly by a film formation method in which film formation particles have small energy, such as a vacuum vapor deposition method, and is not patterned. The laminated structure 70 or the organic layer 170 described below is not patterned. In the display device of Example 1 or the display device of Example 2 described below, the first electrode 51 includes a light reflecting material, specifically, an Al—Nd alloy or an Al—Ni alloy. In the display device of Example 1, the second electrode 52 includes an Mg—Ag alloy.

In the display device of Example 1 or the display device of Example 2 or 3 described below, the first electrode 51 is formed on a substrate. The substrate includes the first substrate 11, a driving circuit formed on the first substrate, and an interlayer insulation layer 40 covering the first substrate and the driving circuit. More specifically, the first electrode 51 is disposed on the interlayer insulation layer 40 including SiON and formed on the basis of a CVD method. In addition, the interlayer insulation layer 40 covers an organic EL element driving unit formed on the first substrate 11. The organic EL element driving unit is constituted by a plurality of TFTs (thin film transistors) 20. The TFTs 20 are electrically connected to the first electrode 51 via a contact plug 26 disposed in the interlayer insulation layer 40. An actual light emitting portion of the laminated structure 70 or the organic layer 170 described below is surrounded by an insulation layer 60 including $SiO_2$. Note that, in the drawings, one TFT 20 is illustrated for one organic EL element driving unit.

The TFT 20 is constituted by a gate electrode 21 formed on the first substrate 11, a gate insulation layer 22 formed on the first substrate 11 and the gate electrode 21, a source/drain region 24 formed on the gate insulation layer 22, and a channel formation region 23 formed between the source/drain regions 24 so as to face the gate electrode 21.

In the display device of Example 1, the laminated structure 70 including a light emitting layer containing an organic light emitting material is disposed as a continuous layer common to all the pixels. The laminated structure 70 that generates white light by color mixing includes: in order from the first electrode side, for example,

[A] the first organic layer 71 constituted by a laminated structure obtained by laminating a hole injection layer, a hole transport layer, a light emitting layer (specifically, a first light emitting layer 71A as a red light emitting layer), and an electron transport layer;

[C] the second organic layer 72 constituted by a laminated structure obtained by laminating a hole injection layer, a hole transport layer, a light emitting layer (specifically, a second light emitting layer 72A as a green light emitting layer), and an electron transport layer; and

[E] the third organic layer 73 constituted by a laminated structure obtained by laminating a hole injection layer, a hole transport layer, a light emitting layer (specifically, a third light emitting layer 73A as a blue light emitting layer), and an electron transport layer. In addition,

[B] the first charge generation layer 74 is formed between the first organic layer 71 and the second organic layer 72, and

[D] the second charge generation layer 75 is formed between the second organic layer 72 and the third organic layer 73.

The hole injection layer injects holes into the hole transport layer, and includes a hexaazatriphenylene derivative, for example. The hole transport layer transports the holes injected from the hole injection layer to a light emitting layer, and includes 4,4',4"-tris(3-methylphenylphenylamino) triphenylamine (m-MTDATA) or α-naphthylphenyl diamine (αNPD), for example. The red light emitting layer generates red light utilizing an organic EL phenomenon, and is formed by mixing 30% by mass of 2,6-bis[(4'-methoxydiphenylamino) styryl]-1,5-dicyanonaphthalene (BSN) with 4,4-bis(2,2-diphenylvinyl) biphenyl (DPVBi), for example. The green light emitting layer generates green light utilizing an organic EL phenomenon, and is formed by mixing 5% by mass of coumarin 6 with DPVBi, for example. The blue light emitting layer generates blue light utilizing an organic EL phenomenon, and is formed by mixing 2.5% by mass of 4,4'-bis[2-{4-(N,N-diphenylamino) phenyl} vinyl] biphenyl (DPAVBi) with DPVBi, for example. The electron transport layer transports electrons to a light emitting layer, and includes 8-hydroxyquinoline aluminum (Alq3), for example. However, the materials constituting the layers are illustrative, and are not limited to these materials.

In the display device of Example 1 or Example 2 described below, the light emitting element 10 may have a resonator structure in which the laminated structure 70 or the organic layer 170 described below is a resonance portion. In this case, in order to appropriately adjust a distance from a light emitting surface to a reflecting surface (specifically, for example, the first electrode 51 and the second electrode 52), the thickness of the laminated structure 70 or the organic layer 170 described below is preferably $8 \times 10^{-8}$ m or more and $5 \times 10^{-7}$ m or less, and more preferably $1.5 \times 10^{-7}$ m or more and $3.5 \times 10^{-7}$ m or less.

Hereinafter, an outline of a method for manufacturing the display device (organic EL display device) of Example 1 will be described.

The second substrate 12 is prepared. Specifically, the color filter layer CF and the light shielding layer BM are formed on the second substrate 12 by a known method.

[Step-100]

Meanwhile, a light emitting element driving unit is formed on the first substrate 11 on the basis of a known TFT manufacturing process, and then the interlayer insulation layer 40 is formed on the entire surface on the basis of a CVD method. Then, in a portion of the interlayer insulation layer 40 located above one of the source/drain regions 24 of the TFT 20, a connection hole is formed on the basis of photolithography technology and etching technology. Thereafter, a metal layer is formed on the interlayer insulation layer 40 including the connection hole on the basis of a sputtering method, for example. Subsequently, the metal layer is patterned on the basis of photolithography technology and etching technology, and the first electrode 51 can be thereby formed on the interlayer insulation layer 40. In addition, the contact plug 26 can be formed in the interlayer insulation layer 40. The first electrode 51 is separated for each of the light emitting elements. In a small number of light emitting elements, a first electrode defect portion is generated by presence of a particle (foreign matter) or a protrusion on a first electrode or formation of a break, a cut portion, or a chip in the first electrode for some reason. That is, the defect region 81 includes a particle present on the first electrode 51, a protrusion present on the first electrode 51, a break formed in the first electrode 51, a cut portion formed in the first electrode 51, or a chip formed in the first electrode 51.

[Step-110]

Thereafter, the insulation layer 60 including $SiO_2$ is formed on the entire surface on the basis of a CVD method. Thereafter, an opening 61 is formed in a portion of the insulation layer 60 located above the first electrode 51 on the basis of photolithography technology and etching technology, and the first electrode 51 is exposed to a bottom of the opening 61. Examples of a planar shape of the opening 61 include a square shape, a square shape with four corners rounded, a rectangular shape, a rectangular shape with four corners rounded, a circular shape, and an elliptical shape.

[Step-120]

Thereafter, on a portion of the first electrode 51 exposed at a bottom of the opening 61 and the insulation layer 60, films of the first organic layer 71, the second organic layer 72, and the third organic layer 73 of the laminated structure 70 are formed on the basis of a vacuum vapor deposition method, and films of the first charge generation layer 74 and the second charge generation layer 75 are formed on the basis of a co-vapor deposition method by vacuum deposition. Subsequently, the second electrode 52 containing an Mg—Ag alloy is formed on the entire surface of the laminated structure 70 on the basis of, for example, a vacuum vapor deposition method (co-vapor deposition method). In this way, films of the laminated structure 70 and the second electrode 52 can be continuously formed on the first electrode 51, for example, in a vacuum atmosphere. Thereafter, the protective film 14 is formed on the entire surface by a CVD method or a PVD method, for example. The defect region 81 in which the laminated structure 70 is in a discontinuous state or in a nonuniform state in a lamination direction is generated due to a first electrode defect portion generated in the first electrode 51.

Incidentally, a lowermost layer of the laminated structure 70 may be constituted by a charge injection/transport layer, and at the time of forming the laminated structure 70, at least a part of the charge injection/transport layer may be in a discontinuous state (stage-discontinuous state) at an edge 61A of the opening 61 in the insulation layer 60. That is, the charge injection/transport layer is brought into a discontinuous state or in a high electrical resistance state. In addition, as a result, the charge injection/transport layer is brought into a high electrical resistance state. Therefore, occurrence of a phenomenon that a leakage current flows via the charge injection/transport layer between a first electrode of a certain light emitting element and a second electrode constituting an adjacent light emitting element can be prevented. Incidentally, specifically, the charge injection/transport layer may be constituted by a hole injection layer. In a case where the hole injection layer is not formed but a hole transport layer is formed, the charge injection/transport layer may be constituted by the hole transport layer.

[Step-130]

Finally, the protective film 14 and the second substrate 12 are bonded to each other via the sealing layer (sealing resin layer) 15. In this way, the display device illustrated in FIG. 1 can be obtained.

As a result of presence of many oxygen atoms or nitrogen atoms in the defect region 81, these oxygen atoms or nitrogen atoms bond to atoms (for example, Ca) constituting the charge generation layers 74 and 75 during film formation of the charge generation layers 74 and 75 or during subsequent thermal treatment, and the charge generation layers 74 and 75 (specifically, the first layers 74A and 75A) are oxidized or nitrided in the defect region 81 to become $CaO_XN_Y$. In a light emitting element including the defect region 81, the charge generation layers 74 and 75 are brought into a high electrical resistance state or an insulated state in the defect region 81. Meanwhile, in a region (normal region 82) other than the defect region, atoms (for example, Ca) constituting the charge generation layers 74 and 75 are hardly oxidized or nitrided. Therefore, the charge generation layers 74 and 75 in the normal region 82 remain in a low electrical resistance state.

Therefore, unlike related art, it is possible to reliably prevent a short circuit between the charge generation layer and the first electrode. A display device having high reliability, long life, high luminance, high efficiency, and high display quality can be manufactured without largely increasing the number of manufacturing steps.

Figure 10:
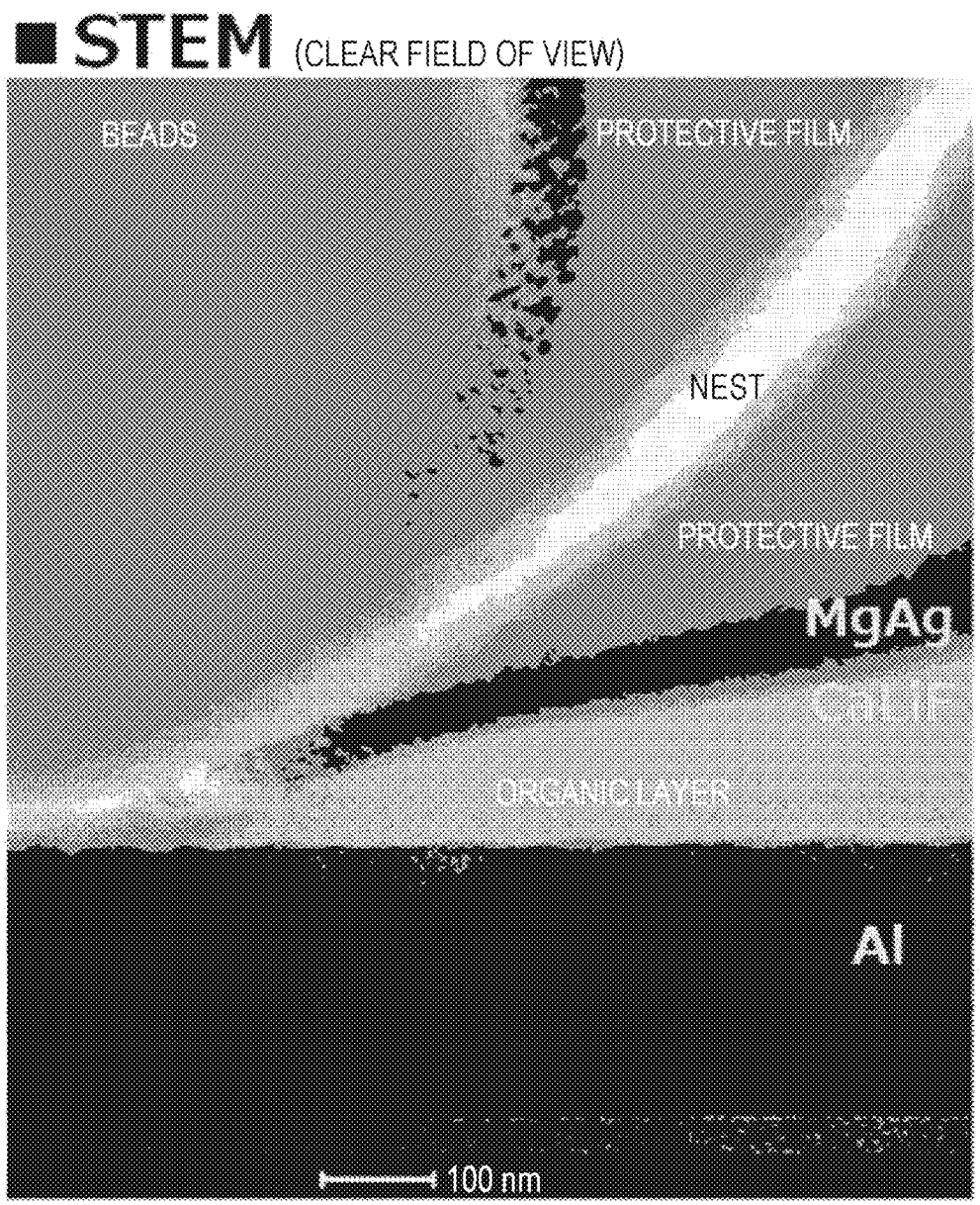
FIG. 10 is a photograph of a scanning transmission electron microscope (STEM) of a light emitting element manufactured experimentally.
Figure 11:
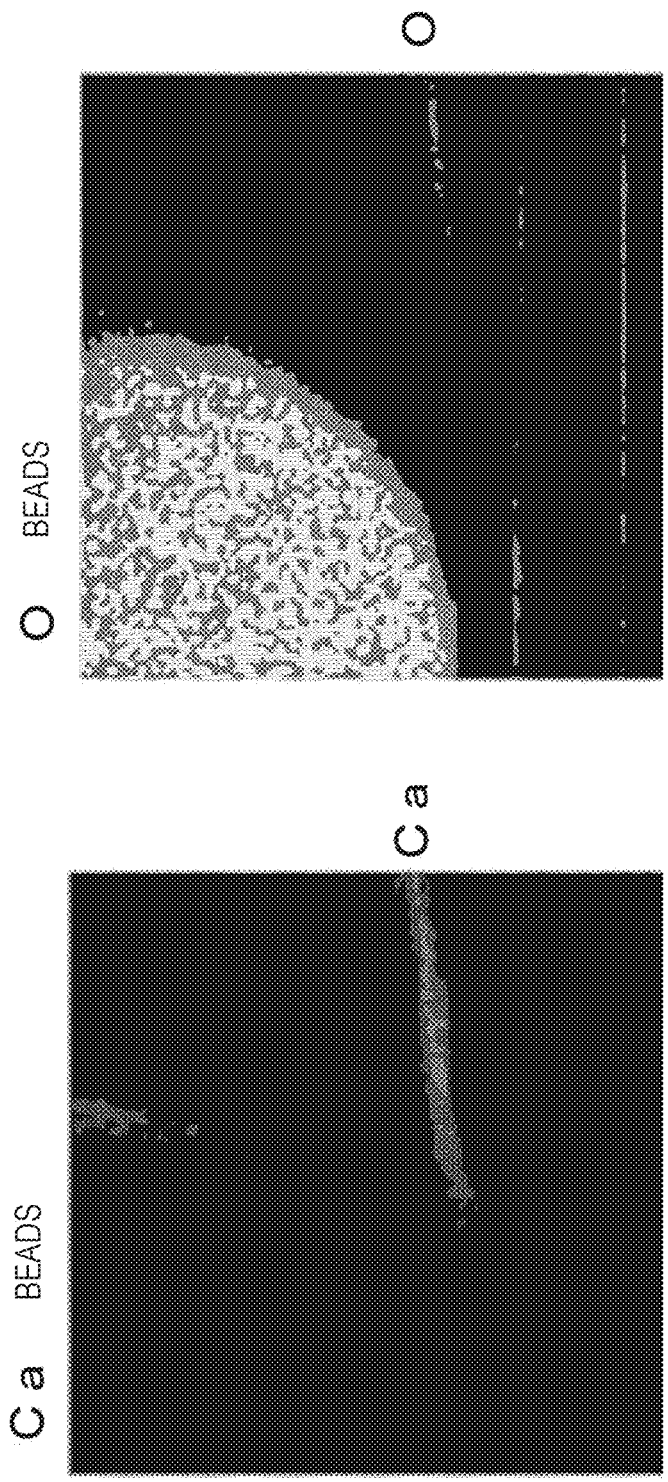
FIG. 11 illustrates photographs of results of energy dispersive X-ray spectroscopy (EDX) in the same field of view as the STEM photograph illustrated in FIG. 10.

A first electrode containing aluminum was formed on a glass substrate. Silica beads corresponding to particles (foreign matters) were scattered on the first electrode. An organic layer was formed on the first electrode containing the silica beads. A $CaLiF_x$ layer, a second electrode containing an Mg—Ag alloy, and a protective film were sequentially formed on the organic layer. FIG. 10 illustrates a photograph of a scanning transmission electron microscope (STEM) of a light emitting element thus obtained and experimentally manufactured. Note that a "nest" was formed in a protective film during formation of the protective film. In addition, FIG. 11 illustrates photographs of an analysis results of a calcium atom and an analysis results of an oxygen atom by energy dispersive X-ray spectroscopy (EDX) in the same field of view as the STEM photograph illustrated in FIG. 10. From the photographs of FIG. 11, it is found that not only a calcium atom but also an oxygen atom is included in a $CaLiF_x$ layer located near silica beads. Note that the photographs of FIG. 11 are not very clear because of the black-and-white photographs. However, in actual photographs of analysis results, it was clearly confirmed that an oxygen atom was present in the $CaLiF_x$ layer.

Incidentally, as illustrated in conceptual diagrams in FIGS. 5A and 5B, the laminated structure 70 may be constituted by two layers of a blue light emitting organic layer and a yellow light emitting organic layer, or two layers of a blue light emitting organic layer and an orange light emitting organic layer. The laminated structure may have at least two organic layers emitting light of the same color.

EXAMPLE 2

Figure 6:
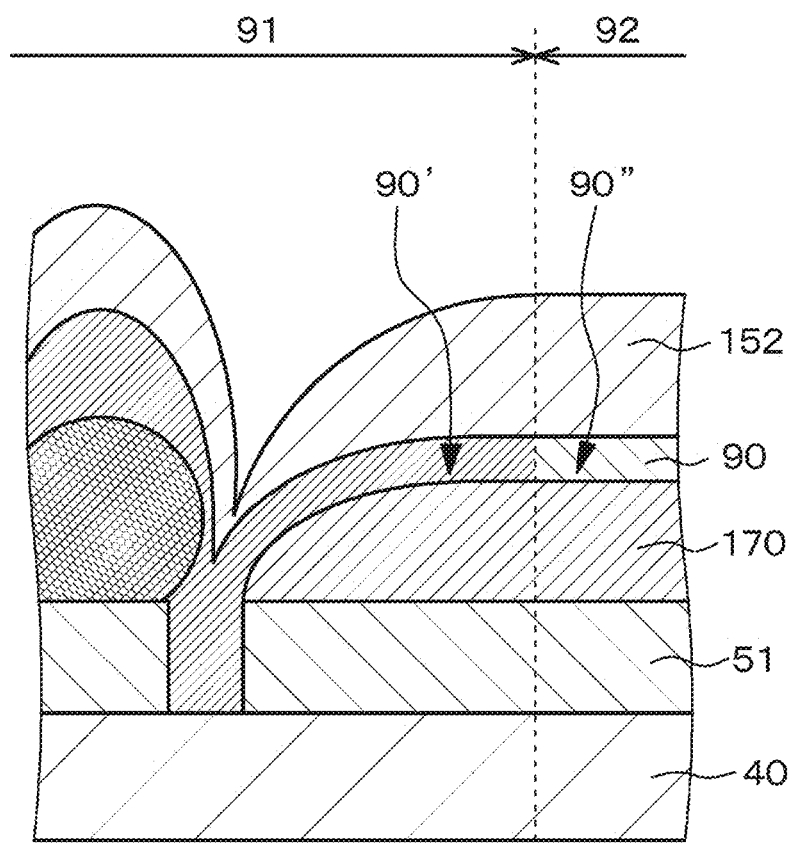
FIG. 6 is a schematic partial cross-sectional view enlarging a light emitting element including a defect region and a normal region in a display device of Example 2.
Figure 7A:
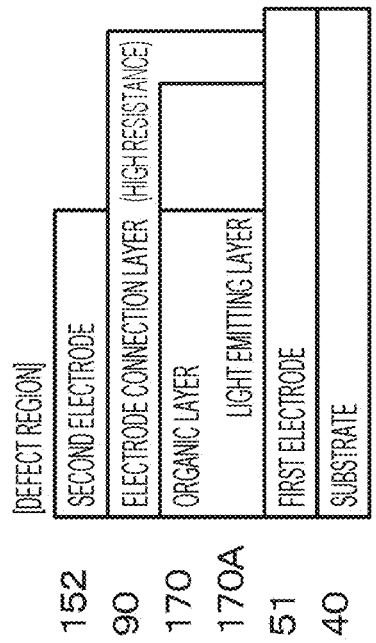
FIG. 7A and FIG. 7B are conceptual diagrams of laminated structures in the display device of Example 2 and the light emitting device of Example 4.
Figure 7B:
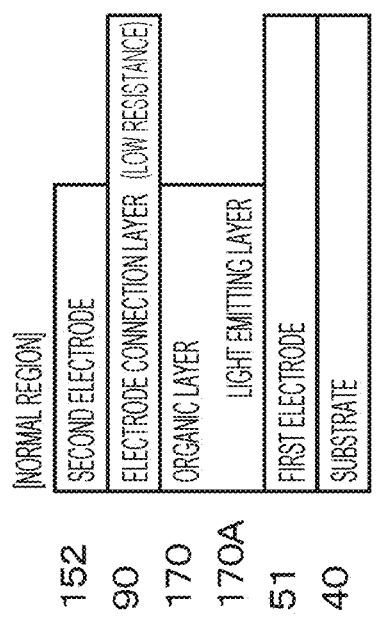

Example 2 relates to a display device according to the second aspect of the present disclosure. The display device of Example 2 is different from Example 1 in the configuration of the laminated structure. A schematic partial cross-sectional view of the display device of Example 2 is substantially similar to that of FIG. 1. As illustrated in a schematic partial cross-sectional view enlarging a light emitting element including a defect region and a normal region in FIG. 6 and conceptual diagrams in FIGS. 7A and 7B, the display device of Example 2 has light emitting elements 10 arranged in a two-dimensional matrix, each of the light emitting elements 10 being formed by laminating: in the following order, (A) a first electrode 51 formed on a substrate;

(B) an organic layer 170 including a light emitting layer 170A containing an organic light emitting material; and (C) a second electrode 152. In addition, each of the light emitting elements 10 further includes an electrode connection layer 90 between the second electrode 152 and the organic layer 170 or between the first electrode 51 and the organic layer 170 (specifically, in Example 2, between the second electrode 152 and the organic layer 170). In a light emitting element including a defect region 91 in which the organic layer 170 is in a discontinuous state or in a nonuniform state in a thickness direction, the electrode connection layer 90 is in a high electrical resistance state or an insulated state in the defect region 91, while being in a low electrical resistance state in a region (normal region 92) other than the defect region 91. The configuration of the organic layer 170 is only required to be the same as that of any one of the first organic layer 71, the second organic layer 72, and the third organic layer 73 in Example 1.

In the display device of Example 2, as in Example 1, the first electrode 51 constitutes an anode electrode and the second electrode 152 constitutes a cathode electrode. Unlike Example 1, the second electrode 152 includes a transparent conductive material such as IZO. The electrode connection layer 90 is constituted by a material containing an alkali metal or an alkaline earth metal. Specifically, the electrode connection layer 90 in the defect region 91 includes $CaO_XN_Y$ or $CsO_XN_Y$ (provided that $1<X<10$ and $1<Y<10$). Meanwhile, the composition of the electrode connection layer 90 in a region (normal region 92) other than the defect region 91 is different from that of the electrode connection layer 90 in the defect region 91. More specifically, in Example 2, a portion 90' of the electrode connection layer 90 in the defect region 91 contains $CaO_XN_Y$, and further contains a material constituting the organic layer. Presence of $CaO_XN_Y$ brings the entire portion into a high resistance state or an insulated state. Meanwhile, a portion 90" of the electrode connection layer 90 in the normal region 92 contains $CaLiF_x$, further contains a material constituting the organic layer, and has a conductive composition. The portion 90' of the electrode connection layer 90 in the defect region 91 extends to the first electrode 51. Furthermore, the thickness of the electrode connection layer 90 (thickness of the portion 90") in a region other than the defect region 91 is larger than the thickness of the electrode connection layer 90 (thickness of the portion 90') in the defect region 91. Specifically, the thickness of the electrode connection layer 90 (portion 90') in the defect region 91 is 5 nm or more, and the thickness of the electrode connection layer 90 (portion 90") in a region other than the defect region 91 is 10 nm or more (more specifically, for example, 20 nm).

Unlike Example 1, one pixel is constituted by three sub-pixels (three light emitting elements) of a red display sub-pixel $SP_R$ (red light emitting element 10R) having a red light emitting organic layer and constituted by a light emitting element that emits red light, a green display sub-pixel $SP_G$ (green light emitting element 10G) having a green light emitting organic layer and constituted by a light emitting element that emits green light, and a blue display sub-pixel $SP_B$ (blue light emitting element 10B) having a blue light emitting organic layer and constituted by a light emitting element that emits blue light. Incidentally, even in these light emitting elements, color purity can be further increased by inclusion of a color filter layer.

Hereinafter, an outline of a method for manufacturing the display device (organic EL display device) of Example 2 will be described.

As in Example 1, a second substrate 12 is prepared. Specifically, the color filter layer CF and the light shielding layer BM are formed on the second substrate 12 on the basis of a known method.

[Step-200]

The first electrode 51 is formed on a substrate in a similar manner to [step-100] in Example 1. In a small number of light emitting elements, a first electrode defect portion is generated by presence of a particle (foreign matter) or a protrusion on a first electrode or formation of a break, a cut portion, or a chip in the first electrode for some reason.

[Step-210]

Thereafter, a step similar to [step-110] in Example 1 is performed.

[Step-220]

Thereafter, the organic layer 170 is formed on a portion of the first electrode 51 exposed at a bottom of the opening 61 and the insulation layer 60 in a similar manner to [step-120] in Example 1. Subsequently, the electrode connection layer 90 is formed on the organic layer 170 in place of the charge generation layer 74 in a similar manner to [step-120] in Example 1. Thereafter, the second electrode 152 including a transparent conductive material such as IZO is formed on the entire surface of the electrode connection layer 90 in a similar manner to [step-120] in Example 1. In this way, films of the organic layer 170, the electrode connection layer 90, and the second electrode 152 can be continuously formed on the first electrode 51, for example, in a vacuum atmosphere. Thereafter, the protective film 14 is formed on the entire surface by a CVD method or a PVD method, for example. The defect region 91 in which the organic layer 170 is in a discontinuous state or in a nonuniform state in a thickness direction is generated due to a first electrode defect portion generated in the first electrode 51. That is, the defect region 91 includes a particle present on the first electrode 51, a protrusion present on the first electrode 51, a break formed in the first electrode 51, a cut portion formed in the first electrode 51, or a chip formed in the first electrode 51.

[Step-230]

Finally, the protective film 14 and the second substrate 12 are bonded to each other via the sealing layer (sealing resin layer) 15. In this way, the display device illustrated in FIGS. 1 and 6 can be obtained.

As a result of presence of many oxygen atoms or nitrogen atoms in the defect region 91, these oxygen atoms or nitrogen atoms bond to atoms (for example, Ca) constituting the electrode connection layer 90 during film formation of the electrode connection layer 90 or during subsequent thermal treatment, and the electrode connection layer 90 is oxidized or nitrided in the defect region 91 to become $CaO_xN_y$. In a light emitting element including the defect region 91 in which the organic layer 170 is in a discontinuous state or in a nonuniform state in a thickness direction, the electrode connection layer 90 is brought into a high electrical resistance state or an insulated state in the defect region 91. Meanwhile, in a region (normal region 92) other than the defect region, atoms (for example, Ca) constituting the electrode connection layer 90 are hardly oxidized or nitrided. Therefore, the electrode connection layer 90 in the normal region 92 remains in a low electrical resistance state.

Therefore, unlike related art, it is possible to reliably prevent a short circuit between the second electrode and the first electrode even without forming a resistive layer. A display device having high reliability, long life, high luminance, high efficiency, and high display quality can be manufactured without largely increasing the number of manufacturing steps.

A display device including a light emitting element in which a $LiF_y$ layer was formed in place of forming the electrode connection layer 90 of Example 2 was manufactured by way of trial as a display device of Comparative Example 2. In the defect region 91, the $LiF_y$ layer is not oxidized nor nitrided.

Figure 12:
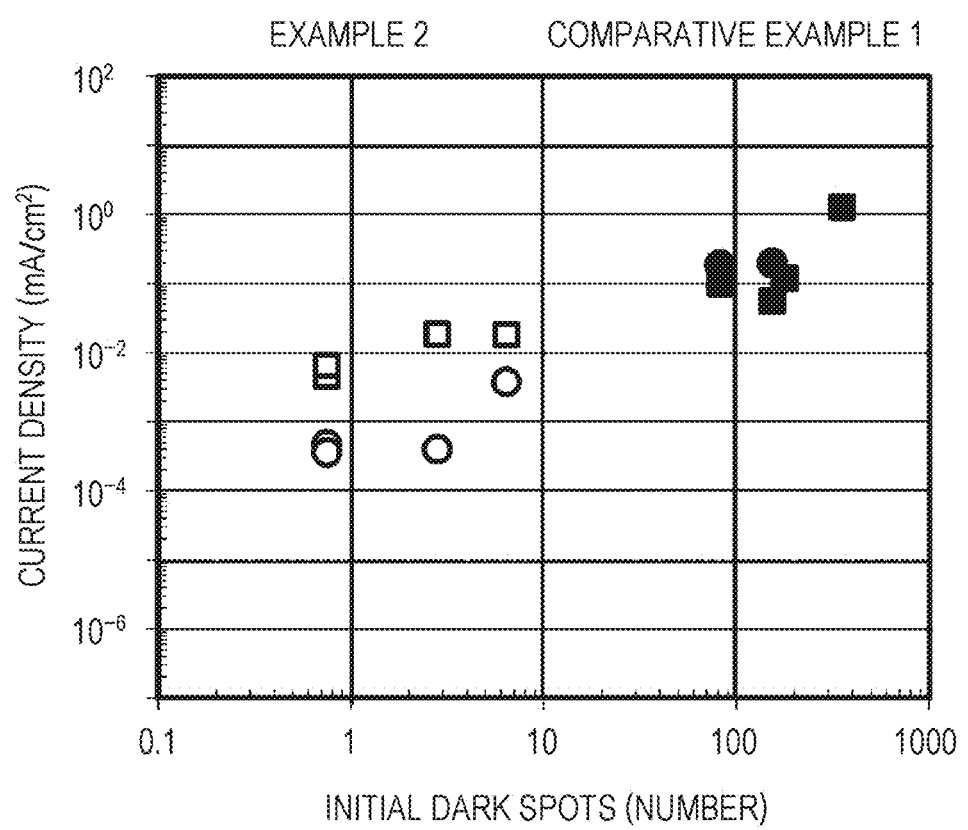
FIG. 12 is a graph illustrating a result of evaluating the number of dark spots of each of the display device of Example 2 and a display device of Comparative Example 2.

In addition, in the display device of Example 2 and the display device of Comparative Example 2, a voltage of 10 V was applied between the first electrode 51 and the second electrode 152, a current flowing between the first electrode 51 and the second electrode 152 was set variously, and dark spots (the number of light emitting elements with initial light emitting defects) per unit area were examined. FIG. 12 illustrates results thereof. A result that the number of dark spots in the display device of Example 2 was drastically smaller than that of the display device of Comparative Example 2 was obtained. That is, it has been found that a display device having high display quality can be obtained by constituting the second electrode 152 with a transparent conductive material such as IZO and forming the electrode connection layer 90 including $CaLiF_x$ in place of a $LiF_y$ layer. Note that no difference was observed between a driving voltage of the display device of Example 2 and a driving voltage of the display device of Comparative Example 2.

Figure 8A:
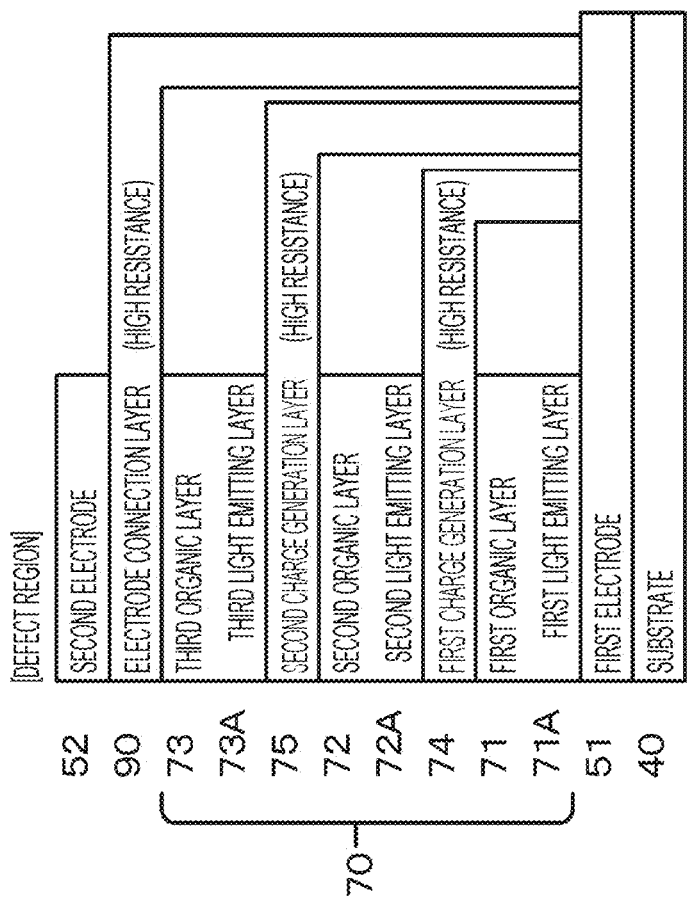
FIG. 8A and FIG. 8B are conceptual diagrams of laminated structure in modified examples of the display device of Example 1 and the light emitting device of Example 4.
Figure 8B:
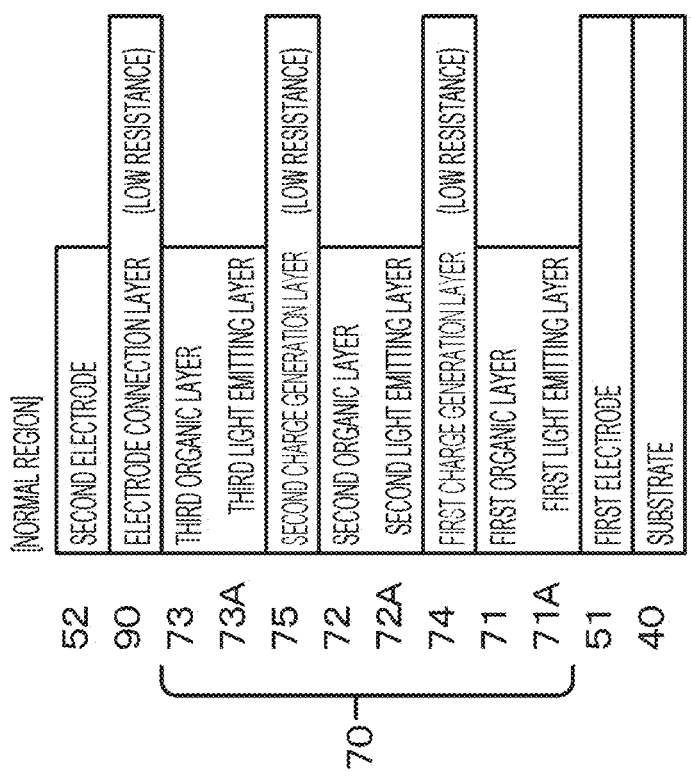

A display device (display device in which Examples 1 and 2 are combined) including the laminated structure 70 in Example 1 and the electrode connection layer 90 in Example 2 can be used. That is, as illustrated in conceptual diagrams in FIGS. 8A and 8B, in the display device of Example 1, the electrode connection layer 90 may be formed between the laminated structure 70 and the second electrode 52 or between the laminated structure 70 and the first electrode 51 (specifically, for example, between the laminated structure 70 and the second electrode 52). In a light emitting element including the defect region 81, the electrode connection layer 90 may be in a high electrical resistance state or an insulated state in the defect region 81, while being in a low electrical resistance state in a region other than the defect region 81.

EXAMPLE 3

Figure 9:
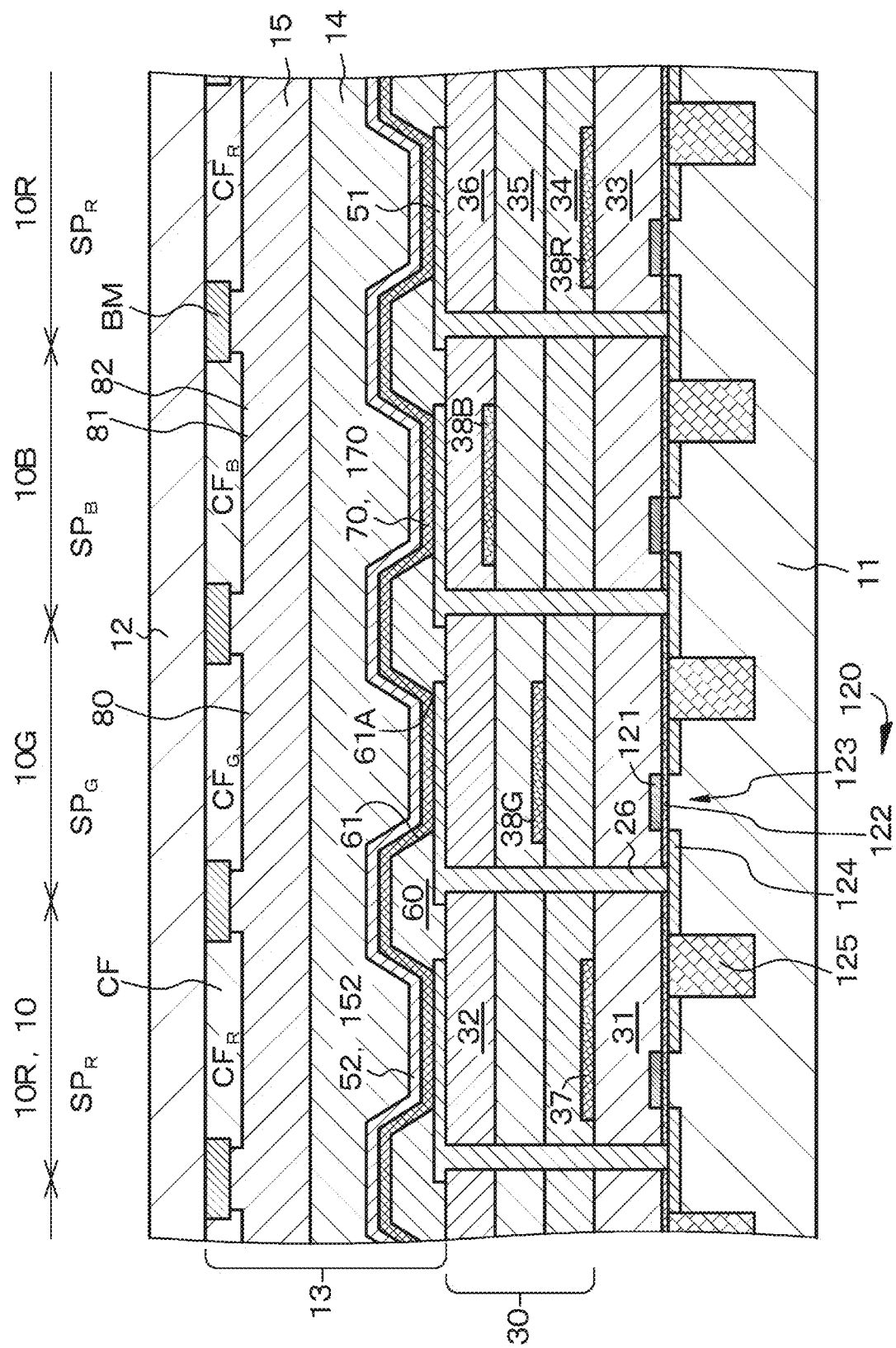
FIG. 9 is a schematic partial cross-sectional view of a display device of Example 3.

Example 3 is a modification of Examples 1 and 2. In Example 3, a light reflecting layer is formed below a first electrode via an interlayer insulation film, and a resonator structure is constituted between the light reflecting layer and a second electrode. FIG. 9 illustrates a schematic partial cross-sectional view of the display device of Example 3 obtained by modifying the display device of Example 1. Note that FIG. 9 illustrates only a light emitting element including no defect region.

A light emitting element 10 of Example 3 includes:
a lower layer/interlayer insulation film 31;
a light reflecting layer 37 formed on the lower layer/interlayer insulation film 31;
an upper layer/interlayer insulation film 32 covering the lower layer/interlayer insulation film 31 and the light reflecting layer 37;
a first electrode 51 formed on the upper layer/interlayer insulation film 32;
an insulation layer 60 formed at least on a region of the upper layer/interlayer insulation film 32 where the first electrode 51 is not formed;
a laminated structure 70 or an organic layer 170 (hereinafter, referred to as "laminated structure 70 or the like" for convenience) formed over the insulation layer 60 from above the first electrode 51; and
second electrodes 52 and 152 (hereinafter, referred to as "second electrode 52 or the like" for convenience) formed on the laminated structure 70 or the like.

In addition, the display device of Example 3 is a display device having a plurality of pixels each constituted by a first light emitting element 10R, a second light emitting element 10G, and a third light emitting element 10B arranged in a two-dimensional matrix. The plurality of pixels has a laminated structure obtained by sequentially laminating a lowermost layer/interlayer insulation film 33, a first interlayer insulation film 34, a second interlayer insulation film 35, and an uppermost layer/interlayer insulation film 36. In addition, each of the light emitting elements 10R, 10G, and 10B includes:
the first electrode 51 formed on the uppermost layer/interlayer insulation film 36;
the insulation layer 60 formed at least on a region of the uppermost layer/interlayer insulation film 36 where the first electrode 51 is not formed;
the laminated structure 70 or the like formed over the insulation layer 60 from above the first electrode 51; and
the second electrode 52 or the like formed on the laminated structure 70 or the like.

The first light emitting element 10R includes a first light reflecting layer 38R formed between the lowermost layer/interlayer insulation film 33 and the first interlayer insulation film 34.

The second light emitting element 10G includes a second light reflecting layer 38G formed between the first interlayer insulation film 34 and the second interlayer insulation film 35.

The third light emitting element 10B includes a third light reflecting layer 38B formed between the second interlayer insulation film 35 and the uppermost layer/interlayer insulation film 36.

Note that the first interlayer insulation film 34, the second interlayer insulation film 35, and the uppermost layer/interlayer insulation film 36 are collectively referred to as an interlayer insulation film/laminated structure 30.

Alternatively, in another expression, the display device of Example 3 includes the first substrate 11, the second substrate 12, and an image display unit 13 sandwiched by the first substrate 11 and the second substrate 12. In the image display unit 13, the plurality of light emitting elements 10 (10R, 10G, and 10B) of Example 3 is arranged in a two-dimensional matrix. Herein, the light emitting elements are formed on a side of the first substrate.

The first electrode 51 includes ITO. The light reflecting layer 37 (first light reflecting layer 38R, second light reflecting layer 38G, and third light reflecting layer 38B) has a laminated structure of titanium (Ti)/aluminum (Al). Furthermore, the first substrate 11 includes a silicon semiconductor substrate, and the second substrate 12 includes a glass substrate. In addition, a MOSFET is formed on the silicon semiconductor substrate in place of a TFT.

In Example 3, the laminated structure 70 or the like may include the materials exemplified in Example 1, or may include materials exemplified below. Also in Examples 1 to 2, the laminated structure 70 or the like may include materials exemplified below.

That is, in Example 3, the laminated structure 70 or the like has a laminated structure of a hole injection layer (HIL), a hole transport layer (HTL), a light emitting layer, an electron transport layer (ETL), and an electron injection layer (EIL). The laminated structure 70 is constituted by at least two organic layers that emit light of different colors, and light emitted from the laminated structure 70 is white. Specifically, the laminated structure 70 has a structure in which three layers of a red light emitting organic layer that emits red light, a green light emitting organic layer that emits green light, and a blue light emitting organic layer that emits blue light are laminated. The red light emitting element 10R, the green light emitting element 10G, and the blue light emitting element 10B have the same configuration and structure except for positions of a color filter layer and a light reflecting layer.

The hole injection layer increases a hole injection efficiency, functions as a buffer layer for preventing leakage, and has a thickness of about 2 nm to 10 nm, for example. The hole injection layer includes a hexaazatriphenylene derivative represented by the following formula (A) or (B), for example.

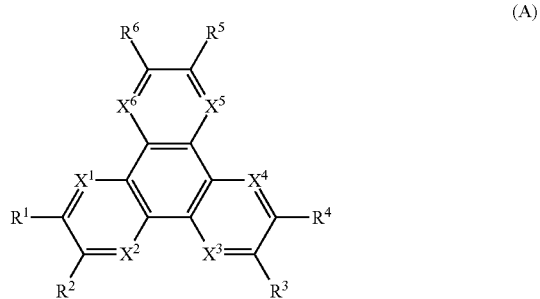

(A)

Herein, $R^1$ to $R^6$ each independently represent a substituent selected from a hydrogen atom, a halogen atom, a hydroxy group, an amino group, an arulamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group, and adjacent $R^m$'s (m=1 to 6) may be bonded to each other via a cyclic structure. In addition, $X^1$ to $X^6$ each independently represent a carbon atom or a nitrogen atom.

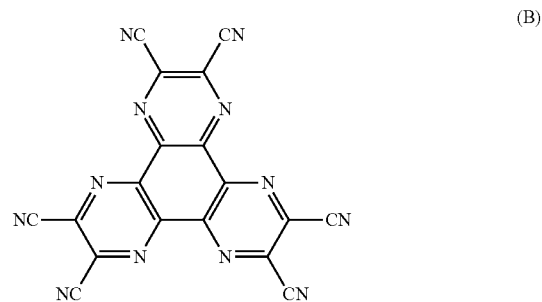 [SMILES: N#Cc1nc2c3nc(C#N)c(C#N)nc3c3nc(C#N)c(C#N)nc3c2nc1C#N]

(B)

The hole transport layer is a layer that increases a hole transport efficiency to the light emitting layer. When an electric field is applied to the light emitting layer, recombination of electrons and holes occurs to generate light. The electron transport layer is a layer that increases an electron transport efficiency to the light emitting layer, and the electron injection layer is a layer that increases an electron injection efficiency to the light emitting layer.

The hole transport layer includes 4,4',4''-tris(3-methylphenylphenylamino) triphenylamine <m-MTDATA> or α-naphthylphenyl diamine <αNPD> having a thickness of about 40 nm, for example.

The laminated structure generates white light by color mixing, and is formed by laminating a red light emitting organic layer, a green light emitting organic layer, and a blue light emitting organic layer as described above, for example.

In the red light emitting organic layer, by application of an electric field, a part of holes injected from the first electrode 51 and a part of electrons injected from the second electrode 52 or the like are recombined to generate red light. Such a red light emitting organic layer contains at least one kind of material among a red light emitting material, a hole transport material, an electron transport material, and a both charge transport material, for example. The red light emitting material may be a fluorescent material or a phosphorescent material. The red light emitting layer having a thickness of about 5 nm is formed by mixing 30% by mass of 2,6-bis [(4'-methoxydiphenylamino) styryl]-1,5-dicyanonaphthalene <BSN> with 4,4-bis(2,2-diphenylvinyl) biphenyl <DPVBi>, for example.

In the green light emitting organic layer, by application of an electric field, a part of holes injected from the first electrode 51 and a part of electrons injected from the second electrode 52 or the like are recombined to generate green light. Such a green light emitting organic layer contains at least one kind of material among a green light emitting material, a hole transport material, an electron transport material, and a both charge transport material, for example. The green light emitting material may be a fluorescent material or a phosphorescent material. The green light emitting layer having a thickness of about 10 nm is formed by mixing 5% by mass of coumarin 6 with DPVBi, for example.

In the blue light emitting organic layer, by application of an electric field, a part of holes injected from the first electrode 51 and a part of electrons injected from the second electrode 52 or the like are recombined to generate blue light. Such a blue light emitting organic layer contains at least one kind of material among a blue light emitting material, a hole transport material, an electron transport material, and a both charge transport material, for example. The blue light emitting material may be a fluorescent material or a phosphorescent material. The blue light emitting layer having a thickness of about 30 nm is formed by mixing 2.5% by mass of 4,4'-bis[2-{4-(N,N-diphenylamino) phenyl} vinyl] biphenyl <DPAVBi> with DPVBi, for example.

The electron transport layer having a thickness of about 20 nm includes 8-hydroxyquinoline aluminum <Alq3>, for example. The electron injection layer having a thickness of about 0.3 nm includes LiF, $Li_2O$, or the like for example.

The lowermost layer/interlayer insulation film 33, the interlayer insulation film/laminated structure 30, the laminated structure 70, and the second electrode 52 or the like are common in the plurality of light emitting elements. That is, the lowermost layer/interlayer insulation film 33, the interlayer insulation film/laminated structure 30, the laminated structure 70, and the second electrode 52 or the like are not patterned and are in a so-called solid film state. As described above, by forming a solid film of an organic layer common in all the light emitting elements without forming the organic layer separately for each light emitting element (patterning formation), the light emitting elements can be also applied to a small and high-resolution display device having a field angle of several inches or less and a pixel pitch of several tens of micrometers or less, for example.

Each of the light emitting elements 10 has a resonator structure using the laminated structure 70 or the like as a resonance part. Incidentally, in order to appropriately adjust a distance from a light emitting surface to a reflecting surface (specifically, a distance from a light emitting surface to the light reflecting layer 37 and the second electrode 52 or the like), the thickness of the laminated structure 70 or the like is preferably $8\times10^{-8}$ m or more and $5\times10^{-7}$ m or less, and more preferably $1.5\times10^{-7}$ m or more and $3.5\times10^{-7}$ m or less. In an organic EL display device having a resonator structure, actually, the red light emitting element 10R causes red light emitted from the light emitting layer to resonate, and emits reddish light (light having a light spectrum peak in a red region) from the second electrode 52 or the like. In addition, the green light emitting element 10G causes green light emitted from the light emitting layer to resonate, and emits greenish light (light having a light spectrum peak in a green region) from the second electrode 52 or the like. Furthermore, the blue light emitting element 10B causes blue light emitted from the light emitting layer to resonate, and emits bluish light (light having a light spectrum peak in a blue region) from the second electrode 52 or the like.

In Example 3, a transistor (specifically, for example, MOSFET) 120 formed on a silicon semiconductor substrate (first substrate 11) is disposed under the lower layer/interlayer insulation film 31 (lowermost layer/interlayer insulation film 33). In addition, the first electrode 51 is connected to the transistor 120 formed on the silicon semiconductor substrate (first substrate 11) via a contact hole (contact plug) 26 formed in the lowermost layer/interlayer insulation film 33 and the interlayer insulation film/laminated structure 30. Herein, the transistor 120 including a MOSFET is constituted by a gate electrode 121, a gate insulation layer 122, a channel formation region 123, and a source/drain region 124. An element isolation region 125 is formed between the transistors 120, and the transistors 120 are thereby separated from each other. Note that such a configuration and structure can be applied to Examples 1 and 2. In addition, the configuration and the structure described in Example 1 can be applied to Example 3.

The configuration and structure of the display device of Example 3 can be similar to those of the display devices of Examples 1 and 2 except for the above-described points, and therefore detailed description will be omitted.

EXAMPLE 4

Example 4 relates to a light emitting device according to the first aspect of the present disclosure. As illustrated in conceptual diagrams in FIGS. 4A and 4B or FIGS. 5A and 5B, the light emitting device includes:

(A) a first electrode 51 formed on a substrate;

(B) a laminated structure 70 formed on the first electrode 51; and (C) a second electrode 52 formed on the laminated structure 70. In addition, the laminated structure 70 is formed by laminating:

in the following order from the first electrode 51 side, at least (B-1) a first organic layer 71 including a first light emitting layer 71A containing an organic light emitting material;

(B-2) a charge generation layer 74 in which a first layer into which a first carrier is injected and a second layer into which a second carrier is injected are laminated; and (B-3) a second organic layer 72 including a second light emitting layer 72A containing an organic light emitting material.

The charge generation layer 74 is in a high electrical resistance state or an insulated state in the defect region 81, while being in a low electrical resistance state in a region other than the defect region 81.

That is, in such a light emitting device of Example 4, the entire light emitting device is constituted by one light emitting element in the display device of Example 1. However, unlike the display device of Example 1, a color filter layer is unnecessary, and white light is emitted from the light emitting device.

Incidentally, as in the display device of Example 1, the first electrode 51 constitutes an anode electrode, the second electrode 52 constitutes a cathode electrode, the first carrier is an electron, the second carrier is a hole, and the first layer constituting the charge generation layer 74 is constituted by a material containing an alkali metal or an alkaline earth metal. In addition, the first layer constituting the charge generation layer 74 in the defect region 81 contains $CaO_XN_Y$ or $CsO_XN_Y$ (provided that $1<X<10$ and $1<Y<10$), and the composition of the first layer constituting the charge generation layer 74 in a region other than the defect region 81 is different from that of the first layer constituting the charge generation layer 74 in the defect region 81. In addition, the thickness of the charge generation layer 74 in a region (normal region 82) other than the defect region 81 is larger than that of the charge generation layer 74 in the defect region 81. The thickness of the charge generation layer 74 in the defect region 81 is 5 nm or more, and the thickness of the charge generation layer 74 in a region other than the defect region 81 is 10 nm or more.

Alternatively, Example 4 relates to a light emitting device according to the second aspect of the present disclosure. As illustrated in conceptual diagrams in FIGS. 7A and 7B or FIGS. 8A and 8B, the light emitting device includes a light emitting portion formed by laminating: in the following order, (A) a first electrode 51 formed on a substrate;

(B) an organic layer 170 including a light emitting layer containing an organic light emitting material; and (C) a second electrode 152.

The light emitting portion further includes an electrode connection layer 90 between the second electrode 152 and the organic layer 170 or between the first electrode 51 and the organic layer 170 (specifically, between the second electrode 152 and the organic layer 170).

The electrode connection layer 90 is in a high electrical resistance state or an insulated state in the defect region 91, while being in a low electrical resistance state in a region (normal region 92) other than the defect region 91.

That is, in such a light emitting device of Example 4, the entire light emitting device is constituted by one light emitting element in the display device of Example 2. However, unlike the display device of Example 2, white light is emitted from the light emitting device.

Incidentally, as in the display device of Example 2, the electrode connection layer 90 may include a material containing an alkali metal or an alkaline earth metal. In addition, in this case, the electrode connection layer 90 in the defect region 91 includes $CaO_XN_Y$ or $CsO_XN_Y$ (provided that $1<X<10$ and $1<Y<10$), and the composition of the electrode connection layer 90 in a region (normal region 92) other than the defect region 91 is different from that of the electrode connection layer 90 in the defect region 81. Furthermore, the thickness of the electrode connection layer 90 in a region (normal region 92) other than the defect region 91 is larger than that of the electrode connection layer 90 in the defect region 91. The thickness of the electrode connection layer 90 in the defect region 91 is 5 nm or more, and the thickness of the electrode connection layer 90 in a region other than the defect region 91 is 10 nm or more.

In addition, the electrode connection layer 90 may be formed between the laminated structure 70 and the second electrode 52 or between the laminated structure 70 and the first electrode 51 (specifically, between the laminated structure 70 and the second electrode 52). The electrode connection layer 90 may be in a high electrical resistance state or an insulated state in the defect region 81, while being in a low electrical resistance state in a region other than the defect region 81.

As a result of presence of many oxygen atoms or nitrogen atoms in the defect regions 81 and 91, these oxygen atoms or nitrogen atoms bond to atoms (for example, Ca) constituting the charge generation layer 74 or the electrode connection layer 90 during film formation of the laminated structure 70 or the like or during subsequent thermal treatment, and the charge generation layer 74 or the electrode connection layer 90 is oxidized or nitrided in the defect regions 81 and 91 to become $CaO_XN_Y$. In a light emitting portion including the defect regions 81 and 91 in which the charge generation layer 74 or the organic layer 170 is in a discontinuous state or in a nonuniform state in a lamination direction (thickness direction), the charge generation layer 74 or the electrode connection layer 90 is brought into a high electrical resistance state or an insulated state in the defect regions 81 and 91. Meanwhile, in a region (normal regions 82 and 92) other than the defect regions, atoms (for example, Ca) constituting the charge generation layer 74 or the electrode connection layer 90 are hardly oxidized or nitrided. Therefore, the charge generation layer 74 or the electrode connection layer 90 in the normal regions 82 and 92 remains in a low electrical resistance state. Therefore, unlike related art, it is possible to reliably prevent a short circuit between the charge generation layer 74 or the second electrode 52 and the first electrode 51 even without forming a resistive layer. A light emitting device having high reliability, long life, high luminance, high efficiency, and high display quality can be manufactured without largely increasing the number of manufacturing steps.

Hitherto, the display device of the present disclosure has been described on the basis of preferable Examples. However, the display device or the light emitting device of the present disclosure is not limited to these Examples. The configurations and structures of the display device, the light emitting element, the light emitting device, and the light emitting portion described in Examples, various materials constituting the display device, the light emitting element, and the light emitting portion, the methods for manufacturing the display device, the light emitting element, the light emitting device, and the light emitting portion, and the like are illustrative and can be modified appropriately. In Example 1, one pixel is constituted exclusively by three sub-pixels formed by a combination of a white light emitting element and a color filter layer. However, one pixel may be formed by four sub-pixels obtained by adding a light emitting element that emits white light. Alternatively, in Example 2, one pixel may be constituted by four sub-pixels (light emitting elements) obtained by adding a sub-pixel constituted by a light emitting element that emits white light (or a light emitting element that emits complementary color light).

In Examples, the description has been made on the basis of the top emission type display device that emits light from the second substrate. However, a bottom emission type display device that emits light from the first substrate may be used. In this case, the configurations of the laminated structure, the organic layer, the first electrode, and the second electrode described in Examples 1 to 4 are only required to be reversed upside down. In addition, it is only required to use an on-chip color filter (OCCF) structure in which a color filter layer is disposed on the first substrate in place of disposing the color filter layer on the second substrate.

Note that the present disclosure may have the following configurations.

[A01]<<Display Device: First Aspect>>

A display device having light emitting elements arranged in a two-dimensional matrix, in which each of the light emitting elements includes:

(A) a first electrode formed on a substrate;

(B) a laminated structure formed on the first electrode; and (C) a second electrode formed on the laminated structure, the laminated structure is formed by laminating:

in the following order from the first electrode side, at least (B-1) a first organic layer including a first light emitting layer containing an organic light emitting material;

(B-2) a charge generation layer in which a first layer into which a first carrier is injected and a second layer into which a second carrier is injected are laminated; and (B-3) a second organic layer including a second light emitting layer containing an organic light emitting material, and in a light emitting element including a defect region, the charge generation layer is in a high electrical resistance state or an insulated state in a defect region, while being in a low electrical resistance state in a region other than the defect region.

[A02] The display device according to [A01], in which the first electrode constitutes an anode electrode and the second electrode constitutes a cathode electrode, the first carrier is an electron and the second carrier is a hole, and the first layer constituting the charge generation layer is constituted by a material containing an alkali metal or an alkaline earth metal.

[A03] The display device according to [A02], in which the first layer constituting the charge generation layer in the defect region contains $CaO_XN_Y$ or $CsO_XN_Y$ (provided that $1<X<10$ and $1<Y<10$), and the composition of the first layer constituting the charge generation layer in a region other than the defect region is different from the composition of the first layer constituting the charge generation layer in the defect region.

[A04] The display device according to any one of [A01] to [A03], in which the thickness of the charge generation layer in a region other than the defect region is larger than the thickness of the charge generation layer in the defect region.

[A05] The display device according to [A04], in which the thickness of the charge generation layer in the defect region is 5 nm or more, and the thickness of the charge generation layer in a region other than the defect region is 10 nm or more.

[A06] The display device according to any one of [A01] to [A05], in which an electrode connection layer is formed between the laminated structure and the second electrode or between the laminated structure and the first electrode, and in a light emitting element including a defect region, the electrode connection layer is in a high electrical resistance state or an insulated state in a defect region, while being in a low electrical resistance state in a region other than the defect region.

[A07] The display device according to [A06], in which the electrode connection layer is constituted by a material containing an alkali metal or an alkaline earth metal.

[A08] The display device according to [A07], in which the electrode connection layer in the defect region includes $CaO_XN_Y$ or $CsO_XN_Y$ (provided that $1<X<10$ and $1<Y<10$), and the composition of the electrode connection layer in a region other than the defect region is different from the composition of the electrode connection layer in the defect region.

[A09] The display device according to any one of [A06] to [A08], in which the thickness of the electrode connection layer in a region other than the defect region is larger than the thickness of the electrode connection layer in the defect region.

[A10] The display device according to [A09], in which the thickness of the electrode connection layer in the defect region is 5 nm or more, and the thickness of the electrode connection layer in a region other than the defect region is 10 nm or more.

[A11] The display device according to any one of [A01] to [A10], in which the laminated structure is in a discontinuous state in the defect region.

[A12] The display device according to any one of [A01] to [A11], in which the laminated structure is nonuniform in a lamination direction in the defect region.

[A13] The display device according to any one of [A01] to [A12], in which the defect region includes a particle present on the first electrode, a protrusion present on the first electrode, a break formed in the first electrode, a cut portion formed in the first electrode, or a chip formed in the first electrode.

[B01]<<Display Device: Second Aspect>>

A display device having light emitting elements arranged in a two-dimensional matrix, each of the light emitting elements being formed by laminating: in the following order, (A) a first electrode formed on a substrate;

(B) an organic layer including a light emitting layer containing an organic light emitting material; and (C) a second electrode, in which each of the light emitting elements further includes an electrode connection layer between the second electrode and the organic layer or between the first electrode and the organic layer, and in a light emitting element including a defect region, the electrode connection layer is in a high electrical resistance state or an insulated state in a defect region, while being in a low electrical resistance state in a region other than the defect region.

[B02] The display device according to [B01], in which the electrode connection layer is constituted by a material containing an alkali metal or an alkaline earth metal.

[B03] The display device according to [B02], in which the electrode connection layer in the defect region includes $CaO_XN_Y$ or $CsO_XN_Y$ (provided that $1<X<10$ and $1<Y<10$), and the composition of the electrode connection layer in a region other than the defect region is different from the composition of the electrode connection layer in the defect region.

[B04] The display device according to any one of [B01] to [B03], in which the thickness of the electrode connection layer in a region other than the defect region is larger than the thickness of the electrode connection layer in the defect region.

[B05] The display device according to [B04], in which the thickness of the electrode connection layer in the defect region is 5 nm or more, and the thickness of the electrode connection layer in a region other than the defect region is 10 nm or more.

[B06] The display device according to any one of [B01] to [B05], in which the organic layer is in a discontinuous state in the defect region.

[B07] The display device according to any one of [B01] to [B05], in which the organic layer is nonuniform in a thickness direction in the defect region.

[B08] The display device according to any one of [B01] to [B07], in which the defect region includes a particle present on the first electrode, a protrusion present on the first electrode, a break formed in the first electrode, a cut portion formed in the first electrode, or a chip formed in the first electrode.

[C01]<<Light Emitting Device: First Aspect>>

A light emitting device including a light emitting portion including:

(A) a first electrode formed on a substrate;

(B) a laminated structure formed on the first electrode; and (C) a second electrode formed on the laminated structure, in which the laminated structure is formed by laminating:

in the following order from the first electrode side, at least (B-1) a first organic layer including a first light emitting layer containing an organic light emitting material;

(B-2) a charge generation layer in which a first layer into which a first carrier is injected and a second layer into which a second carrier is injected are laminated; and (B-3) a second organic layer including a second light emitting layer containing an organic light emitting material, and the charge generation layer is in a high electrical resistance state or an insulated state in a defect region, while being in a low electrical resistance state in a region other than the defect region.

[C02] The light emitting device according to [C01], in which the first electrode constitutes an anode electrode and the second electrode constitutes a cathode electrode, the first carrier is an electron and the second carrier is a hole, and the first layer constituting the charge generation layer is constituted by a material containing an alkali metal or an alkaline earth metal.

[C03] The light emitting device according to [C02], in which the first layer constituting the charge generation layer in the defect region contains $CaO_XN_Y$ or $CsO_XN_Y$ (provided that $1<X<10$ and $1<Y<10$), and the composition of the first layer constituting the charge generation layer in a region other than the defect region is different from the composition of the first layer constituting the charge generation layer in the defect region.

[C04] The light emitting device according to any one of [C01] to [C03], in which the thickness of the charge generation layer in a region other than the defect region is larger than the thickness of the charge generation layer in the defect region. [C05] The light emitting device according to [C04], in which the thickness of the charge generation layer in the defect region is 5 nm or more, and the thickness of the charge generation layer in a region other than the defect region is 10 nm or more.

[C06] The light emitting device according to any one of [C01] to [C05], in which an electrode connection layer is formed between the laminated structure and the second electrode or between the laminated structure and the first electrode, and the electrode connection layer is in a high electrical resistance state or an insulated state in the defect region, while being in a low electrical resistance state in a region other than the defect region.

[C07] The light emitting device according to [C06], in which the electrode connection layer is constituted by a material containing an alkali metal or an alkaline earth metal.

[C08] The light emitting device according to [C07], in which the electrode connection layer in the defect region includes $CaO_XN_Y$ or $CsO_XN_Y$ (provided that $1<X<10$ and $1<Y<10$), and the composition of the electrode connection layer in a region other than the defect region is different from the composition of the electrode connection layer in the defect region.

[C09] The light emitting device according to any one of [C06] to [C08], in which the thickness of the electrode connection layer in a region other than the defect region is larger than the thickness of the electrode connection layer in the defect region.

[C10] The light emitting device according to [C09], in which the thickness of the electrode connection layer in the defect region is 5 nm or more, and the thickness of the electrode connection layer in a region other than the defect region is 10 nm or more.

[C11] The light emitting device according to any one of [C01] to [C10], in which the laminated structure is in a discontinuous state in the defect region.

[C12] The light emitting device according to any one of [C01] to [C11], in which the laminated structure is nonuniform in a lamination direction in the defect region.

[C13] The light emitting device according to any one of [C01] to [C12], in which the defect region includes a particle present on the first electrode, a protrusion present on the first electrode, a break formed in the first electrode, a cut portion formed in the first electrode, or a chip formed in the first electrode.

[D01]<<Light Emitting Device: Second Aspect>>

A light emitting device including a light emitting portion formed by laminating: in the following order, (A) a first electrode formed on a substrate;

(B) an organic layer including a light emitting layer containing an organic light emitting material; and (C) a second electrode, in which the light emitting portion further includes an electrode connection layer between the second electrode and the organic layer or between the first electrode and the organic layer, and the electrode connection layer is in a high electrical resistance state or an insulated state in a defect region, while being in a low electrical resistance state in a region other than the defect region.

[D02] The light emitting device according to [D01], in which the electrode connection layer is constituted by a material containing an alkali metal or an alkaline earth metal.

[D03] The light emitting device according to [D02], in which the electrode connection layer in the defect region includes $CaO_XN_Y$ or $CsO_XN_Y$ (provided that $1<X<10$ and $1<Y<10$), and the composition of the electrode connection layer in a region other than the defect region is different from the composition of the electrode connection layer in the defect region.

[D04] The light emitting device according to any one of [D01] to [D03], in which the thickness of the electrode connection layer in a region other than the defect region is larger than the thickness of the electrode connection layer in the defect region.

[D05] The light emitting device according to [D04], in which the thickness of the electrode connection layer in the defect region is 5 nm or more, and the thickness of the electrode connection layer in a region other than the defect region is 10 nm or more.

[D06] The light emitting device according to any one of [D01] to [D05], in which the organic layer is in a discontinuous state in the defect region.

[D07] The light emitting device according to any one of [D01] to [D05], in which the organic layer is nonuniform in a thickness direction in the defect region.

[D08] The light emitting device according to any one of [D01] to [D07], in which the defect region includes a particle present on the first electrode, a protrusion present on the first electrode, a break formed in the first electrode, a cut portion formed in the first electrode, or a chip formed in the first electrode.

REFERENCE SIGNS LIST

10 Light emitting element (display element)
10R Red light emitting element (first light emitting element)

10G Green light emitting element (second light emitting element)
10B Blue light emitting element (third light emitting element)
$SP_R$ Red display sub-pixel
$SP_G$ Green display sub-pixel
$SP_B$ Blue display sub-pixel
11 First substrate
12 Second substrate
13 Image display unit
14 Protective film
15 Sealing layer (sealing resin layer)
20 Thin film transistor (TFT)
120 MOSFET
21, 121 Gate electrode
22, 122 Gate insulation layer
23, 123 Channel formation region
24, 124 Source/drain region
125 Element isolation region
26 Contact hole (contact plug)
30 Interlayer insulation film/laminated structure
31 Lower layer/interlayer insulation film
32 Upper layer/interlayer insulation film
33 Lowermost layer/interlayer insulation film
34 First interlayer insulation film
35 Second interlayer insulation film
36 Uppermost layer/interlayer insulation film
37 Light reflecting layer
38R First light reflecting layer
38G Second light reflecting layer
38B Third light reflecting layer
40 Interlayer insulation layer
51 First electrode
52, 152 Second electrode
60 Insulation layer
61 Opening
61A Edge of opening
70 Laminated structure
71, 72, 73 Organic layer
71A, 72A, 73A Light emitting layer
74, 75 Charge generation layer
74A' Region in which first layer of charge generation layer in defect region is in high electrical resistance state or insulated state
74A" Region of first layer of charge generation layer in low electrical resistance state in normal region
74A, 75A First layer into which first carrier in charge generation layer is injected
74B, 75B Second layer into which second carrier in charge generation layer is injected
81, 91 Defect region
82, 92 Normal region
90 Electrode connection layer
90' Portion of electrode connection layer in defect region
90" Portion of electrode connection layer in normal region
170 Organic layer
CF, $CF_R$, $CF_G$, $CF_B$ Color filter layer
BM Light shielding layer (black matrix layer)

The invention claimed is:
1. A display device comprising:
layer of first electrodes;
a second electrode; and
a laminated structure that extends from within a defect region to within a region other than the defect region,
wherein in the defect region, a first portion of the laminated structure:
is in a high electrical resistance state or an insulated state, and
is between one of the first electrodes and an additional one of the first electrodes,
wherein in the region other than the defect region, a second portion of the laminated structure:
is in a low electrical resistance state, and
is between the second electrode and the one of the first electrodes.

2. The display device according to claim 1, wherein the first portion of the laminated structure touches the second portion of the laminated structure.

3. The display device according to claim 1, wherein the first electrode are anode electrodes and the second electrode is a cathode electrode.

4. The display device according to claim 1, wherein the laminated structure comprises an organic layer, the organic layer contains an organic light emitting material.

5. The display device according to claim 4, wherein the laminated structure comprises a charge generation layer.

6. The display device according to claim 5, wherein a thickness of the charge generation layer in a region other than the defect region is larger than a thickness of the charge generation layer in the defect region.

7. The display device according to claim 5, wherein the charge generation layer is constituted by a material containing an alkali metal or an alkaline earth metal.

8. The display device according to claim 5, wherein a composition of the charge generation layer in the region other than the defect region is different from a composition of the charge generation layer in the defect region.

9. The display device according to claim 5, wherein in the defect region, the charge generation layer contains $CaO_XN_Y$ or $CsO_XN_Y$ (provided that 1<X<10 and 1<Y<10).

10. The display device according to claim 5, wherein in the defect region, the charge generation layer is between the one of the first electrodes and the additional one of the first electrodes.

11. The display device according to claim 5, wherein in the region other than the defect region, the charge generation layer is between the organic layer and the second electrode.

12. The display device according to claim 4, wherein the laminated structure comprises an electrode connection layer.

13. The display device according to claim 12, wherein a composition of the electrode connection layer in the region other than the defect region is different from a composition of the electrode connection layer in the defect region.

14. The display device according to claim 12, wherein a thickness of the electrode connection layer in the region other than the defect region is larger than a thickness of the electrode connection layer in the defect region.

15. The display device according to claim 12, wherein the electrode connection layer in the defect region includes $CaO_XN_Y$ or $CsO_XN_Y$ (provided that 1<X<10 and 1<Y<10).

16. The display device according to claim 12, wherein the defect region, the electrode connection layer is between the between one of the first electrodes and the additional one of the first electrodes.

17. The display device according to claim 12, wherein the region other than the defect region, the electrode connection layer is between the organic layer and the second electrode.

18. The display device according to claim 1, further comprising:
a transistor that is electrically connected to one of the first electrodes.

19. The display device according to claim 18, further comprising:

another transistor that is electrically connected to the additional one of the first electrodes.

* * * * *